(12) United States Patent
Wu et al.

(10) Patent No.: US 11,984,646 B2
(45) Date of Patent: May 14, 2024

(54) ELECTRONIC DEVICE

(71) Applicant: HUAWEI TECHNOLOGIES CO., LTD., Guangdong (CN)

(72) Inventors: Pengfei Wu, Shanghai (CN); Hanyang Wang, Reading (GB); Chien-Ming Lee, Shenzhen (CN); Dong Yu, Shanghai (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 224 days.

(21) Appl. No.: 17/610,846

(22) PCT Filed: May 12, 2020

(86) PCT No.: PCT/CN2020/089827
§ 371 (c)(1),
(2) Date: Nov. 12, 2021

(87) PCT Pub. No.: WO2020/228703
PCT Pub. Date: Nov. 19, 2020

(65) Prior Publication Data
US 2022/0223999 A1    Jul. 14, 2022

(30) Foreign Application Priority Data

May 13, 2019 (CN) .......................... 201910393785.6
May 23, 2019 (CN) .......................... 201910435969.4

(51) Int. Cl.
*H01Q 1/24* (2006.01)
*H01Q 1/42* (2006.01)
(Continued)

(52) U.S. Cl.
CPC .............. *H01Q 1/243* (2013.01); *H01Q 1/42* (2013.01); *H04M 1/0216* (2013.01); *H04M 1/0268* (2013.01); *H05K 1/118* (2013.01)

(58) Field of Classification Search
CPC ............ H01Q 1/243; H01Q 1/42; H01Q 5/40; H01Q 5/378; H01Q 1/22; H01Q 1/2266;
(Continued)

(56) References Cited

U.S. PATENT DOCUMENTS 5,561,436 A   10/1996  Phillips
2008/0300028 A1  12/2008  Uejima et al.
(Continued)

FOREIGN PATENT DOCUMENTS

CN    102037604 A    4/2011
CN    102544699 A    7/2012
(Continued)

OTHER PUBLICATIONS

Li Chuan, Multi-antenna System for 5G Multi-mode Terminal, University of Electronic Science and Technology, Feb. 2017, 2 pages(abstract).

*Primary Examiner* — Daniel D Chang
(74) *Attorney, Agent, or Firm* — WOMBLE BOND DICKINSON (US) LLP

(57) ABSTRACT

An electronic device includes a first part and a second part that can be folded or expanded relative to each other. The electronic device has a closed state and an open state When the electronic device is in the closed state, a frame of the first part and a frame of the second part partially or totally overlap. The first part includes a first feeding antenna. The second part includes a first parasitic antenna, and when the electronic device is in the closed state, the first parasitic antenna is not grounded and can be coupled to the first feeding antenna.

20 Claims, 26 Drawing Sheets

(51) Int. Cl.
  *H04M 1/02* (2006.01)
  *H05K 1/11* (2006.01)
(58) Field of Classification Search
  CPC ............ H01Q 1/273; H01Q 1/44; H01Q 1/48;
    H01Q 1/50; H01Q 5/10; H01Q 5/28;
    H01Q 21/0006; H04M 1/0216; H04M
    1/0268; H05K 1/118
  See application file for complete search history.

(56) References Cited

U.S. PATENT DOCUMENTS

| | | | |
|---|---|---|---|
| 2010/0013720 A1* | 1/2010 | Sakata | H01Q 1/243 |
| | | | 343/702 |
| 2014/0320379 A1 | 10/2014 | Hamabe | |
| 2017/0294713 A1 | 10/2017 | Liu | |
| 2018/0366813 A1 | 12/2018 | Kim et al. | |
| 2019/0097314 A1 | 3/2019 | Rajagopalan et al. | |
| 2019/0140342 A1 | 5/2019 | Lim et al. | |

FOREIGN PATENT DOCUMENTS

| | | | | |
|---|---|---|---|---|
| CN | 204045722 U | 12/2014 | | |
| CN | 104733861 A | 6/2015 | | |
| CN | 106711579 A | 5/2017 | | |
| CN | 107394358 A | 11/2017 | | |
| CN | 107454215 A | 12/2017 | | |
| CN | 107851884 A | 3/2018 | | |
| CN | 108292796 A | 7/2018 | | |
| CN | 108352601 A | 7/2018 | | |
| CN | 108767499 A | 11/2018 | | |
| CN | 109361062 A | 2/2019 | | |
| CN | 109728412 A | 5/2019 | | |
| EP | 3343693 A1 | 7/2018 | | |
| EP | 3439103 A1 | 2/2019 | | |
| EP | 3439103 A1 * | 2/2019 | ............ | H01Q 1/243 |
| KR | 20170056292 A | 5/2017 | | |
| KR | 20170136258 A | 12/2017 | | |
| TW | 201826623 A | 7/2018 | | |
| WO | 2016064415 A1 | 4/2016 | | |

\* cited by examiner

ELECTRONIC DEVICE

This disclosure is a National Stage of International Patent Application No. PCT/CN2020/089827, filed on May 12, 2020, which claims priority to Chinese Patent Application No. 201910393785.6, filed on May 13, 2019 and Chinese Patent Application No. 201910435969.4, filed on May 23, 2019, all of which are incorporated herein by reference in their entireties.

TECHNICAL FIELD

Embodiments of this disclosure relate to the field of wireless communications technologies, and in particular, to an electronic device.

BACKGROUND

With technical development of components such as a flexible display, an identity (ID) form of an electronic device (for example, a mobile phone) tends to develop from a bar phone to a foldable phone. In an open state, the foldable phone has a large-area screen, which fully meets visual experience of consumers. In a closed state, the foldable phone is quite small in volume and easy to carry. However, when the foldable phone is in the closed state, antenna performance of a low-band antenna in a conventional antenna architecture significantly decreases compared with antenna performance in the open state, and the antenna performance is poor.

SUMMARY

Embodiments of this disclosure provide an electronic device. The electronic device has relatively high antenna performance in a closed state.

An embodiment of this disclosure provides an electronic device, including a first part and a second part. The first part and the second part can be folded relative to each other to a closed state, and can be expanded relative to each other to an open state. When the first part and the second part are in the closed state, a frame of the first part and a frame of the second part partially or totally overlap.

The first part includes a first feeding antenna, a first feeding circuit, and a first grounding circuit. The first feeding circuit is connected to the first feeding antenna, and is configured to feed the first feeding antenna. The first grounding circuit is connected to the first feeding antenna, and is configured to enable the first feeding antenna to be grounded.

The second part includes a first parasitic antenna. When the first part and the second part are in the closed state, the first parasitic antenna is not grounded and can be coupled to the first feeding antenna to generate a first excited resonance signal through excitation.

In an embodiment, when the first part and the second part are in the closed state, the first parasitic antenna and the first feeding antenna are disposed at least partially opposite to each other to generate a coupling capacitor between the first parasitic antenna and the first feeding antenna, so that the first excited resonance signal can be generated through coupling. When the first feeding antenna works, radio frequency energy of the first feeding antenna is transmitted to the first parasitic antenna through coupling, so that an additional resonance mode is generated through excitation on the first parasitic antenna, radiating frequency bandwidth of the antenna is extended, adverse impact on antenna performance that is caused by a reduction in a length of a ground plane and frame overlap in the closed state is reduced, and antenna performance of the electronic device is improved, that is, the electronic device has relatively high antenna performance in the closed state. When the first parasitic antenna is not grounded, an electrical length is ½ wavelength, in other words, the first parasitic antenna is a ½ wavelength antenna. In this case, the reduction in the length of the ground plane during folding has relatively weak impact on performance of the first parasitic antenna, so that the first parasitic antenna can maintain good radiation performance when the first part and the second part are in the closed state, thereby effectively extending radiating frequency bandwidth of the first feeding antenna.

In an embodiment, a matching circuit may be further disposed between the first feeding circuit and the first feeding antenna, and the matching circuit is configured to match feature impedance. The matching circuit may include at least one circuit component. For example, the matching circuit may include at least one of a resistor, an inductor, or a capacitor used as lumped elements. For example, the matching circuit may include at least one of a microstrip and a strip used as distribution elements.

In an embodiment, the second part further includes a second feeding antenna. The second feeding antenna is electrically isolated from the first parasitic antenna. When the first part and the second part are in the open state, the first parasitic antenna can be coupled to the second feeding antenna to generate a second excited resonance signal through excitation.

In this embodiment, when the first part and the second part are in the open state, the first parasitic antenna can be coupled to the second feeding antenna, and a coupling capacitor is generated between the first parasitic antenna and the second feeding antenna, so that the second excited resonance signal can be generated through coupling and excitation. When the second feeding antenna works, radio frequency energy of the second feeding antenna is transmitted to the first parasitic antenna through coupling, so that an additional resonance mode is generated through excitation on the first parasitic antenna, thereby extending radiating frequency bandwidth of the antenna and improving antenna performance of the electronic device. Because the first parasitic antenna can be coupled to the first feeding antenna when the first part and the second part are in the closed state, and can be coupled to the second feeding antenna when the first part and the second part are in the open state, the electronic device can multiplex the first parasitic antenna, so that antenna utilization is improved.

In an embodiment, when the first part and the second part are in the open state, the first feeding antenna, the second feeding antenna, and the first parasitic antenna are located in different corner regions of the electronic device. In this case, the first feeding antenna and the second feeding antenna may work in close frequency bands, and the first feeding antenna and the second feeding antenna have relatively large space and a relatively low degree of mutual interference. The first parasitic antenna may also be better separately coupled to the first feeding antenna and the second feeding antenna in the two states.

In an embodiment, the second part further includes a second feeding circuit and a second grounding circuit. The second grounding circuit is connected to one end of the second feeding antenna, and is configured to enable the second feeding antenna to be grounded. The other end of the second feeding antenna is an ungrounded open end. The second feeding circuit is connected to the second feeding antenna, and a connection position of the second feeding circuit on the second feeding antenna is located between a connection position of the second grounding circuit on the second feeding antenna and the open end. In this case, the second feeding antenna is a ¼ wavelength antenna. When the first part and the second part are in the open state, the first parasitic antenna is grounded. In this case, an electrical length of the first parasitic antenna is ¼ wavelength, in other words, the first parasitic antenna is a ¼ wavelength antenna. The electrical length of the first parasitic antenna is adjustable, so that there can be different electrical lengths in different use environments.

In an embodiment, a coupling effect between the first parasitic antenna and the second feeding antenna is excellent, and bandwidth of the second feeding antenna can be extended to a relatively large extent. To improve the coupling effect, for example, an end of the second feeding antenna that is away from the first parasitic antenna is a grounding end, and an end of the second feeding antenna that is close to the first parasitic antenna is an open end.

In an embodiment, a matching circuit may be further disposed between the second feeding circuit and the second feeding antenna, and the matching circuit is configured to match feature impedance. The matching circuit may include at least one circuit component. For example, the matching circuit may include at least one of a resistor, an inductor, or a capacitor used as lumped elements. For example, the matching circuit may include at least one of a microstrip and a strip used as distribution elements.

In an embodiment, the second part further includes a switching circuit. One end of the switching circuit is connected to the first parasitic antenna, and the other end is grounded. The switching circuit is configured to disconnect the first parasitic antenna from the ground when the first part and the second part are in the closed state. In this case, the electrical length of the first parasitic antenna is ½ wavelength. The switching circuit is further configured to connect the first parasitic antenna to the ground when the first part and the second part are in the open state. In this case, the electrical length of the first parasitic antenna is ¼ wavelength.

In an embodiment, by disposing the switching circuit, the electrical length of the first parasitic antenna is adjustable, and the first parasitic antenna can implement different coupling functions when the electronic device is in different use states, so that the antenna is multiplexed.

For example, the switching circuit may include a tuning switch. The switching circuit switches a connection relationship between the first parasitic antenna and the ground by switching the tuning switch between a closed state and an open state, so that the electrical length of the first parasitic antenna is adjustable. For example, the tuning switch may be roughly connected to a middle part of the first parasitic antenna. In this disclosure, a middle part of an antenna includes a central location and another location that slightly deviates from the central location, and the middle part of the antenna is located between both ends of the antenna. The middle part of the first parasitic antenna is located between both ends of the first parasitic antenna.

For another example, the switching circuit may include a tuning switch, a first matching branch, and a second matching branch. The first matching branch is different from the second matching branch. A control end of the tuning switch is connected to the first parasitic antenna, and two selection ends of the tuning switch are connected to the first matching branch and the second matching branch. The switching circuit switches a connection relationship between the first parasitic antenna and the ground by switching a connection between the first matching branch and the second matching branch by using the control end of the tuning switch, so that the electrical length of the first parasitic antenna is adjustable.

In an embodiment, the first part further includes a second parasitic antenna. When the first part and the second part are in the closed state, the second parasitic antenna is not grounded and can be coupled to the second feeding antenna to generate a third excited resonance signal through excitation. In this case, the second parasitic antenna is a ½ wavelength antenna. When the first part and the second part are in the open state, the second parasitic antenna may be located in an upper left corner of the electronic device. The second parasitic antenna, the first feeding antenna, the second feeding antenna, and the first parasitic antenna are located in different corner regions of the electronic device. When the first part and the second part are in the open state, the second parasitic antenna can be coupled to the first feeding antenna to generate a fourth excited resonance signal through excitation. In this case, the second parasitic antenna may be grounded.

In an embodiment, the switching circuit and a physical length of a metal segment in which the first parasitic antenna is located may be designed, so that the first parasitic antenna is switched between a grounded state and an ungrounded state, in other words, the electrical length of the first parasitic antenna is switched between ½ wavelength and ¼ wavelength.

In an embodiment, the second part further includes one or more first tuning circuits. The one or more first tuning circuits are connected to the first parasitic antenna. The first tuning circuit is configured to adjust the electrical length of the first parasitic antenna. In this embodiment, the one or more tuning circuits are connected to the first parasitic antenna, so that the electrical length of the first parasitic antenna meets an adjustment requirement through coordination of the one or more tuning circuits.

The one or more first tuning circuits may be connected to an end of the first parasitic antenna, to better perform a tuning function. For example, the second part includes two first tuning circuits, and the two first tuning circuits are separately connected to both ends of the first parasitic antenna. The first tuning circuit may include one or more of a switch, a capacitor, an inductor, or a low-pass high-cut filter.

In an embodiment, the second part further includes a second feeding antenna, a second feeding circuit, and a second grounding circuit. The second feeding antenna is electrically isolated from the first parasitic antenna. The second grounding circuit is connected to a middle part of the second feeding antenna. Both ends of the second feeding antenna are ungrounded open ends. The second feeding circuit is connected to the second feeding antenna, and a connection position of the second feeding circuit on the second feeding antenna is located between a connection position of the second grounding circuit on the second feeding antenna and one end of the second feeding antenna. In this case, the second feeding antenna is a ½ wavelength antenna. The first parasitic antenna is a floating antenna. In other words, the first parasitic antenna is not grounded.

In an embodiment, when the first part and the second part are in the open state, the second feeding antenna has two antenna modes, has relatively large bandwidth, and has relatively high antenna performance. Therefore, the second feeding antenna may not be coupled to the first parasitic antenna. When the first part and the second part are in the closed state, the first feeding antenna is coupled to the first parasitic antenna of ½ wavelength, to improve antenna performance of the first feeding antenna and reduce adverse impact of an external environment. In this case, for the antenna architecture, there is no need to switch between different antenna coupling forms when the first part and the second part are in different states, in other words, the first parasitic antenna may be a single ½ wavelength antenna, and no switching circuit needs to be disposed, so that a structure of the antenna architecture is simpler.

In an embodiment, the electronic device further includes a fifth feeding antenna, a fifth feeding circuit, a fifth grounding circuit, and a third parasitic antenna. The fifth feeding antenna is located in the second part, and the third parasitic antenna is located in the first part (in another embodiment, the fifth feeding antenna may be located in the first part, and the third parasitic antenna may be located in the second part). The fifth feeding antenna is electrically isolated from the first parasitic antenna and the second feeding antenna. The fifth feeding circuit is connected to the fifth feeding antenna, and is configured to feed the fifth feeding antenna. The fifth grounding circuit is connected to the fifth feeding antenna, and is configured to enable the fifth feeding antenna to be grounded. When the first part and the second part are in the closed state, the third parasitic antenna is not grounded and can be coupled to the fifth feeding antenna to generate a fifth excited resonance signal through excitation. In this case, an electrical length of the third parasitic antenna is ½ wavelength, in other words, the third parasitic antenna is a ½ wavelength antenna. In an embodiment, the fifth feeding antenna may be configured to radiate a medium- and high-frequency signal.

In an embodiment, the electronic device further includes a rotation part. The rotation part connects the first part and the second part. The rotation part can be deformed, so that the first part and the second part rotate relative to each other to fold or expand. The rotation part is located in a central region of the electronic device. That the rotation part is located in a central region of the electronic device means that a center line of the rotation part roughly coincides with a center line of the electronic device (a slight deviation is allowed). When the first part and the second part are in the closed state, the first part and the second part overlap, and a frame of the first part and a frame of the second part totally overlap. In this case, the frame of the first part and the frame of the second part are disposed entirely opposite to each other.

When the first part and the second part are in the open state, the first feeding antenna, the second feeding antenna, and the first parasitic antenna are located in different corner regions of the electronic device. In this case, the first feeding antenna and the second feeding antenna may work in close frequency bands, and the first feeding antenna and the second feeding antenna have relatively large space and a relatively low degree of mutual interference. The first parasitic antenna may also be better separately coupled to the first feeding antenna and the second feeding antenna in the two states.

In an embodiment, the electronic device further includes a rotation part. The rotation part connects the first part and the second part. The rotation part can be deformed, so that the first part and the second part rotate relative to each other to fold or expand. The rotation part deviates from a central region of the electronic device. In this case, a deviation between a center line of the rotation part and a center line of the electronic device is relatively large. When the first part and the second part are in the closed state, an end of one of the first part and the second part protrudes relative to the other part.

When the first part and the second part are in the open state, the electronic device includes two side edges spanning the rotation part, the first feeding antenna and the first parasitic antenna are located on a same side edge, and the second feeding antenna and the first feeding antenna are located on different side edges. In this case, when the first part and the second part are in the closed state, the first feeding antenna and the first parasitic antenna can be coupled to each other. The second feeding antenna and the first feeding antenna are located on different side edges. In this case, both the first feeding antenna and the second feeding antenna have relatively large radiation space.

The first parasitic antenna may extend from a side edge of the electronic device to another edge of the electronic device along an edge of a corner region. The second parasitic antenna may extend from the other side edge of the electronic device to another edge of the electronic device along another corner region.

In an embodiment, the first part is slidably connected to the second part. When sliding relative to each other, the first part and the second part can be folded relative to each other to the closed state, and can also be expanded relative to each other to the open state. When the first part and the second part are in the closed state, the first part and the second part are vertically stacked. When the first part and the second part are in the open state, a small portion of the first part 10 and a small portion of the second part remain in a stacked state, and most of the first part and most of the second part are in a staggered state, namely, an expanded state. In an embodiment, when the first part and the second part are in the open state, the first part and the second part may be totally staggered.

When the first part and the second part are in the closed state, the first feeding antenna and the second feeding antenna are separately located in two diagonally disposed corner regions of the electronic device. In this case, both the first feeding antenna and the second feeding antenna have relatively sufficient radiation space.

In an embodiment, the first feeding antenna and the first parasitic antenna are a part of a frame of the electronic device. The frame of the electronic device includes the frame of the first part and the frame of the second part. For example, the frame of the first part includes at least two metal segments and at least one insulation segment for electrically isolating the at least two metal segments. The first feeding antenna may be formed in one of the metal segments. The frame of the second part includes at least two metal segments and at least one insulation segment for electrically isolating the at least two metal segments. The first parasitic antenna may be formed in one of the metal segments.

Alternatively, the first feeding antenna and the first parasitic antenna are fastened to an inner side of a frame of the electronic device. For example, the first feeding antenna is fastened to an inner side of the frame of the first part. The first parasitic antenna is fastened to an inner side of the frame of the second part. In this case, a structural form of the first feeding antenna may be a flexible circuit board, a laser direct structuring (LDS) metal, an insert molding metal, or a wire of a printed circuit board.

In an embodiment, the first part further includes a second parasitic antenna. When the first part and the second part are in the closed state, the second parasitic antenna is not grounded and can be coupled to the second feeding antenna to generate a third excited resonance signal through excitation. In this case, the second parasitic antenna is a ½ wavelength antenna. When the first part and the second part are in the open state, the second parasitic antenna may be located in an upper left corner of the electronic device. The second parasitic antenna, the first feeding antenna, the second feeding antenna, and the first parasitic antenna are located in different corner regions of the electronic device. When the first part and the second part are in the open state, the second parasitic antenna can be coupled to the first feeding antenna to generate a fourth excited resonance signal through excitation. In this case, the second parasitic antenna may be grounded.

In an embodiment, the second part further includes a third feeding circuit and a first filter circuit. The third feeding circuit and the first filter circuit are connected to different locations of the first parasitic antenna, and are configured to form a third feeding antenna on the first parasitic antenna. A radiating frequency band of the third feeding antenna is different from a radiating frequency band of the first feeding antenna. For example, the first feeding antenna is a low-band antenna. The radiating frequency band of the third feeding antenna is a wireless local area network antenna, a short-range wireless communications antenna, a medium- and high-band antenna, a sub 6G antenna (a frequency is less than 6 GHz), a wireless charging antenna, or the like. In this case, the first filter circuit has a low-cut and high-pass feature. For example, the first filter circuit includes a high-pass low-cut filter.

In this case, the third feeding antenna and the first parasitic antenna share a same segment of radiator, so that antenna utilization can be improved. In addition, because the radiating frequency band of the third feeding antenna is different from the radiating frequency band of the first feeding antenna, the third feeding antenna and the first feeding antenna do not interfere with each other, and are well isolated.

In an embodiment, the electronic device further includes a fourth feeding antenna, a fourth feeding circuit, and a second filter circuit. The fourth feeding antenna is adjacent to and electrically isolated from the first parasitic antenna. The fourth feeding circuit is connected to the fourth feeding antenna. The filter circuit is connected to the first parasitic antenna. A radiating frequency band of the fourth feeding antenna is different from a radiating frequency band of the first feeding antenna. For example, the first feeding antenna is a low-band antenna. The radiating frequency band of the fourth feeding antenna is a wireless local area network antenna, a short-range wireless communications antenna, a medium- and high-band antenna, a wireless charging antenna, or the like. In this case, the second filter circuit has a low-cut and high-pass feature. For example, the second filter circuit includes a high-pass low-cut filter.

In this case, a radiator part in which the first parasitic antenna is located is used as a parasitic branch of the fourth feeding antenna to implement multiplexing, so that antenna utilization can be improved. In addition, because the radiating frequency band of the fourth feeding antenna is different from the radiating frequency band of the first feeding antenna, the fourth feeding antenna and the first feeding antenna do not interfere with each other, and are well isolated.

The fourth feeding antenna may be located in the first part or the second part. A connection position of the fourth feeding antenna on the first parasitic antenna is located between a connection position of the switching circuit on the first parasitic antenna and the fourth feeding antenna.

In an embodiment, the electronic device further includes a sensing apparatus. The sensing apparatus is located in the first part and/or the second part. The sensing apparatus is configured to sense that the first part and the second part are in the closed state or the open state. The sensing apparatus is electrically connected to a processor of the electronic device. The processor is located in the first part and/or the second part. The processor of the electronic device receives a detection signal of the sensing apparatus, and sends a corresponding control signal to another component of the electronic device based on the signal, so that the another component of the electronic device can be adjusted to a corresponding working mode in a timely manner depending on whether the first part and the second part are in the closed state or the open state. In this way, the electronic device has higher reliability and better user experience. The sensing apparatus may include one or more of a gyroscope sensor, a Hall effect sensor, or a proximity light sensor.

In an embodiment, the electronic device further includes a display. The display is configured to display an image, a video, and the like. In this embodiment, the display is a flexible display. The display can be continuously located on a same side of the first part, the rotation part, and the second part, so that when the first part and the second part are in the open state, the electronic device has a continuous large-area display, to implement large-screen display, and when the first part and the second part are in the closed state, the electronic device can implement display on the front, the back, and the side of the electronic device.

In an embodiment, the electronic device further includes a ground plane. The ground plane is grounded and extends from the first part to the second part. In an embodiment, the ground plane is a circuit board of the electronic device. For example, the ground plane may be a flexible circuit board, or the ground plane is a flexible-rigid circuit board. In another embodiment, the ground plane may be integrated into another component, for example, the display, of the electronic device.

DESCRIPTION OF EMBODIMENTS

The following describes the embodiments of this disclosure with reference to the accompanying drawings in the embodiments of this disclosure.

The embodiments of this disclosure provide an electronic device. The electronic device may be a mobile phone, a tablet personal computer, a laptop computer, a personal digital assistant (PDA), a wearable device, or the like.

The electronic device includes a plurality of antennas. In this disclosure, "a plurality of" means at least two. The antenna is configured to transmit and receive electromagnetic wave signals. Each antenna in the electronic device may be configured to cover one or more communication frequency bands. Different antennas may be multiplexed to improve antenna utilization. A form of the antenna may be a dipole antenna, a monopole antenna, an inverted F-shaped antenna (IFA), a patch antenna, or the like.

The electronic device may communicate with a network or another device by using the plurality of antennas through a wireless communications technology. The wireless communications technology includes a global system for mobile communications (GSM), a general packet radio service (GPRS), code division multiple access (CDMA), wideband code division multiple access (WCDMA), time-division code division multiple access (TD-SCDMA), long term evolution (LTE), Bluetooth (BT), a global navigation satellite system (GNSS), a wireless local area network (WLAN) (for example, a wireless fidelity (Wi-Fi) network), a near field communication (NFC) technology, frequency modulation (FM), an infrared (IR) technology, and/or the like. In this disclosure, "A and/or B" includes three cases: "A", "B", and "A and B".

Figure 1:
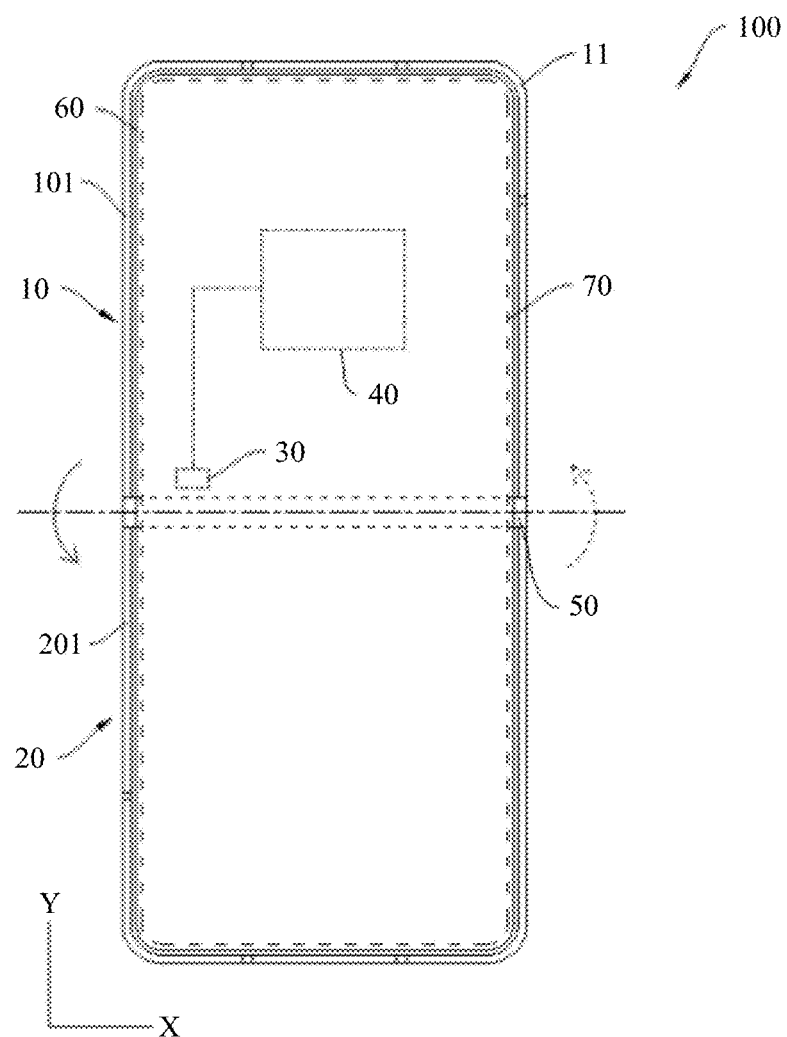
FIG. 1 is a schematic structural diagram of an electronic device in a first embodiment according to the embodiments of this disclosure.
Figure 2:
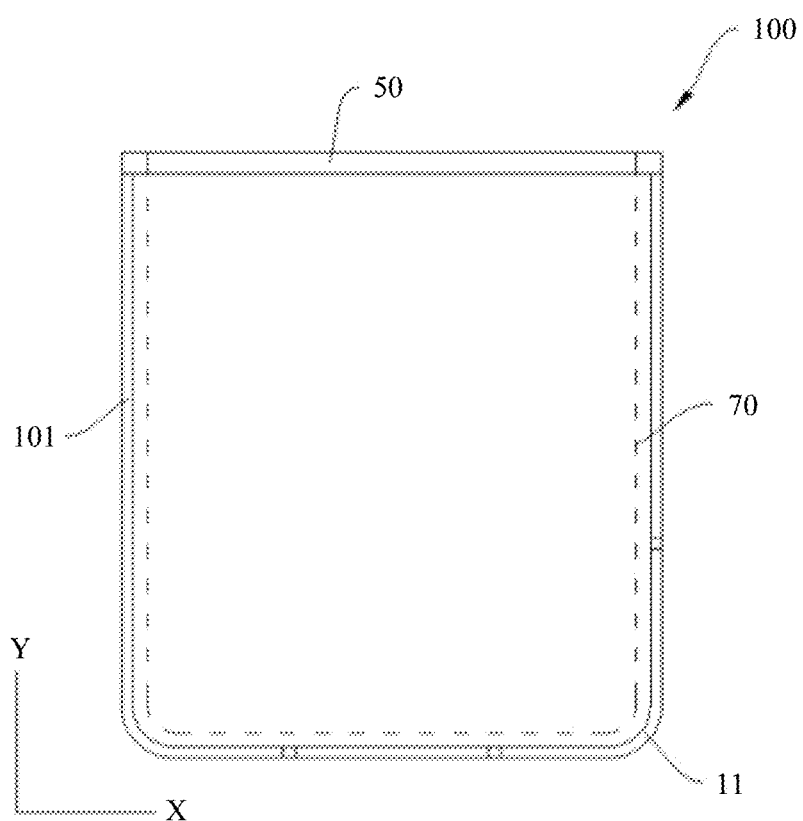
FIG. 2 is a schematic structural diagram of the electronic device shown in FIG. 1 in another use state.
Figure 3:
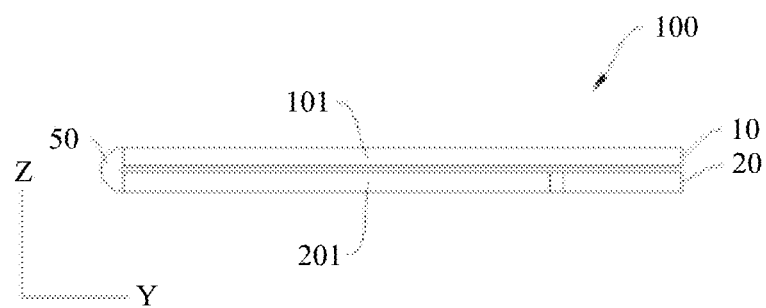
FIG. 3 is a schematic structural diagram of the electronic device shown in FIG. 2 from another angle.

FIG. 1 is a schematic structural diagram of an electronic device in a first embodiment according to the embodiments of this disclosure, FIG. 2 is a schematic structural diagram of the electronic device shown in FIG. 1 in another use state, and FIG. 3 is a schematic structural diagram of the electronic device shown in FIG. 2 from another angle. The electronic device shown in FIG. 1 is described by using a mobile phone as an example.

The electronic device 100 includes a first part 10 and a second part 20. A plurality of antennas may be distributed in the first part 10 and the second part 20. The first part 10 and the second part 20 can be folded relative to each other to a closed state, and can be expanded relative to each other to an open state. In other words, the first part 10 and the second part 20 can be switched between the closed state and the open state. FIG. 1 corresponds to the open state of the electronic device 100. FIG. 2 and FIG. 3 correspond to the closed state of the electronic device 100.

In an embodiment, the electronic device 100 further includes a sensing apparatus 30. The sensing apparatus 30 is located in the first part 10 and/or the second part 20. The sensing apparatus 30 is configured to sense that the first part 10 and the second part 20 are in the closed state or the open state. The sensing apparatus 30 is electrically connected to a processor 40 of the electronic device 100. The processor 40 is located in the first part 10 and/or the second part 20. The processor 40 of the electronic device 100 receives a detection signal of the sensing apparatus 30, and sends a corresponding control signal to another component of the electronic device 100 based on the signal, so that the another component of the electronic device 100 can be adjusted to a corresponding working mode in a timely manner depending on whether the first part 10 and the second part 20 are in the closed state or the open state. In this way, the electronic device 100 has higher reliability and better user experience. The sensing apparatus 30 may include one or more of a gyroscope sensor, a Hall effect sensor, or a proximity light sensor.

In an embodiment, there are a plurality of connection relationships between the first part 10 and the second part 20, for example, a rotary connection, a sliding connection, and a detachable snap-fit connection. In this embodiment, an example in which the first part 10 is rotatably connected to the second part 20 is used for description. For example, the electronic device 100 further includes a rotation part 50. The rotation part 50 connects the first part 10 and the second part 20. The rotation part 50 can be deformed, so that the first part 10 and the second part 20 rotate relative to each other to fold or expand. As shown in FIG. 1, when the first part 10 and the second part 20 rotate relative to each other to expand to the open state, the rotation part 50 is located between the first part 10 and the second part 20, and the rotation part 50 is located in a central region of the electronic device 100. That the rotation part 50 is located in a central region of the electronic device 100 means that a central line of the rotation part 50 roughly coincides with a central line of the electronic device 100 (a slight deviation is allowed). The rotation part 50 extends in a first direction X, and the first part 10 and the second part 20 rotate relative to each other in the first direction X. In this case, as shown in FIG. 2 and FIG. 3, when the first part 10 and the second part 20 are in the closed state, the first part 10 and the second part 20 overlap, and a frame 101 of the first part 10 and a frame 201 of the second part 20 totally overlap. In this case, the frame 101 of the first part 10 and the frame 201 of the second part 20 are disposed entirely opposite to each other. A frame of the electronic device 100 includes the frame 101 of the first part 10 and the frame 201 of the second part 20. Most components of the electronic device 100 are located on an inner side of the frame of the electronic device 100. In another embodiment, the rotation part 50 may alternatively deviate from a central region of the electronic device 100. This embodiment is described later.

In an embodiment, the electronic device 100 further includes a display 60. The display 60 is configured to display an image, a video, and the like. In this embodiment, the display 60 uses a flexible display, for example, an organic light emitting diode (OLED) display, an active-matrix organic light-emitting diode (AMOLED) display, a mini organic light-emitting diode display, a micro light-emitting diode display, a micro organic light-emitting diode display, or a quantum dot light emitting diode (QLED) display. In this case, the display 60 can be continuously located on a same side of the first part 10, the rotation part 50, and the second part 20, so that when the first part 10 and the second part 20 are in the open state, the electronic device 100 has a continuous large-area display, to implement large-screen display, and when the first part 10 and the second part 20 are in the closed state, the electronic device 100 can implement display on the front, the back, and the side of the electronic device 100.

In another embodiment, the display 60 may alternatively use a rigid display, for example, a liquid crystal display (LCD). In this case, the display 60 may include two display parts, and the two display parts are separately located in the first part 10 and the second part 20.

In an embodiment, when the first part 10 and the second part 20 of the electronic device 100 rotate relative to each other, there may be a plurality of flip manners. For example, as shown by a solid arrow in FIG. 1, in one flip manner, when the first part 10 and the second part 20 are folded relative to each other, a part of the display 60 located in the first part 10 and a part of the display 60 located in the second part 20 approach each other face to face, and when the first part 10 and the second part 20 are in the closed state, the display 60 is located on an inner side of the first part 10 and the second part 20. This flip manner is also referred to as inward folding of the display 60. In another flip manner, as shown by a dashed arrow in FIG. 1, when the first part 10 and the second part 20 are folded relative to each other, a part of the display 60 located in the first part 10 and a part of the display 60 located in the second part 20 become distant from each other back to back, and when the first part 10 and the second part 20 are in the closed state, the display 60 is located on an outer side of the first part 10 and the second part 20. This flip manner is also referred to as outward folding of the display 60.

In an embodiment, the first part 10 includes a first feeding antenna 11. The first feeding antenna 11 may have a plurality of structural forms. For example, the first feeding antenna 11 is a part of the frame 101 of the first part 10 of the electronic device 100, or is fastened to an inner side of the frame 101 of the first part 10. In this embodiment, an example in which the first feeding antenna 11 is a part of the frame 101 of the first part 10 is used for description. The frame 101 of the first part 10 includes at least two metal segments and at least one insulation segment for electrically isolating the at least two metal segments. The first feeding antenna 11 may be formed in one of the metal segments. In another embodiment, the first feeding antenna 11 is fastened to the inner side of the frame 101 of the first part 10. In this case, a structural form of the first feeding antenna 11 may be a flexible circuit board, a laser direct structuring (LDS) metal, an insert molding metal, or a wire of a printed circuit board.

Referring to FIG. 1, the electronic device 100 further includes a ground plane 70. The ground plane 70 is grounded and extends from the first part 10 to the second part 20. In an embodiment, the ground plane 70 is a circuit board of the electronic device 100. For example, the ground plane 70 may be a flexible circuit board, or the ground plane 70 is a flexible-rigid circuit board. In another embodiment, the ground plane 70 may be integrated into another component, for example, the display 60, of the electronic device 100.

In an embodiment, the first feeding antenna 11 is a grounded ¼ wavelength antenna. The first feeding antenna 11 may be a low-band antenna (600 MHz to 960 MHz), for example, LTE B28 (703 MHz to 803 MHz) or LTE B30 (791 MHz to 862 MHz). When the first part 10 and the second part 20 are in the open state, the first feeding antenna 11 may radiate by using a relatively long ground plane 70, to achieve relatively high performance.

Referring to FIG. 1 to FIG. 3, in this embodiment, after the first part 10 and the second part 20 switch from the open state to a folded state, a length of the ground plane 70 in a second direction (perpendicular to the first direction X) is reduced by approximately half, the frame 101 of the first part 10 and the frame 201 of the second part 20 overlap, space of the first feeding antenna 11 is affected, and low-frequency performance decreases greatly compared with that in the open state.

Figure 4:
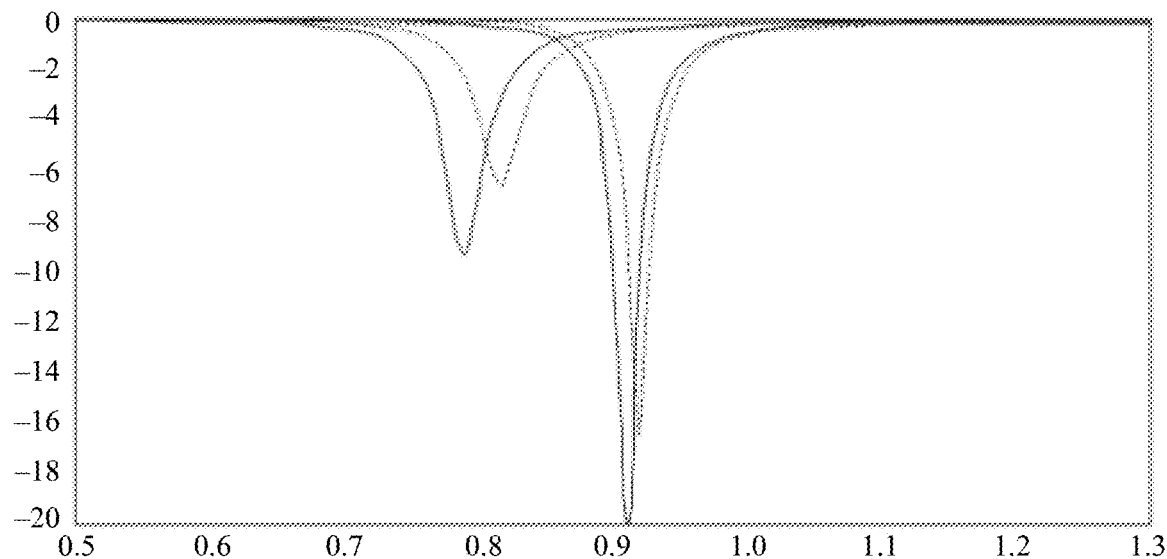
FIG. 4 is a reflection coefficient line graph of an example structure of the electronic device shown in FIG. 1.
Figure 5:
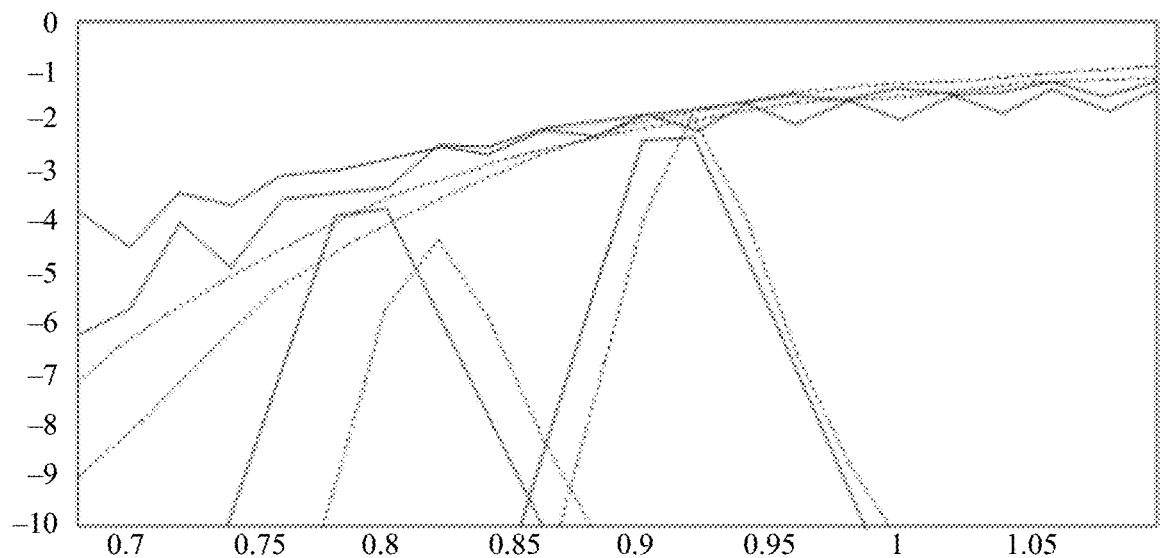
FIG. 5 is an efficiency line graph of an example structure of the electronic device shown in FIG. 1.

For example, FIG. 4 is a reflection coefficient line graph of an example structure of the electronic device shown in FIG. 1, and FIG. 5 is an efficiency line graph of an example structure of the electronic device shown in FIG. 1. FIG. 4 and FIG. 5 illustrate comparison results of the first feeding antenna 11 in two frequency bands: low-band LTE B20 (791 MHz to 862 MHz) and LTE B8 (880 MHz to 960 MHz). In FIG. 4 and FIG. 5, solid lines represent performance of the first feeding antenna 11 when the first part 10 and the second part 20 are in the open state, and dotted lines represent performance of the first feeding antenna 11 when the first part 10 and the second part 20 are in the closed state. In FIG. 4, a horizontal coordinate represents a frequency (in a unit of GHz), and a vertical coordinate represents a reflection coefficient (in a unit of dB). In FIG. 5, a horizontal coordinate represents a frequency (in a unit of GHz), and a vertical coordinate represents efficiency (in a unit of dB).

In the example structures corresponding to FIG. 4 and FIG. 5, the first feeding antenna 11 is a frame antenna in a form of an inverted F-shaped antenna. The first feeding antenna 11 is located in an upper right corner of the first part 10 that is away from the second part 20 (is located in an upper right corner of the electronic device 100 when the first part 10 and the second part 20 are in the open state). A frame thickness and width of the electronic device 100 are approximately 4 millimeters and 3 millimeters, respectively. A width of a clearance area between the frame of the electronic device 100 and the ground plane 70 is approximately 1 millimeter. A gap width between two adjacent metal segments in the frame of the electronic device 100 is approximately 1.5 millimeters. A dielectric constant and a loss angle of an insulating material used for an insulation segment between two adjacent metal segments and an insulating material filled in the clearance area between the frame of the electronic device 100 and the ground plane 70 are 3.0 and 0.01, respectively. The rotation part 50 of the first part 10 and the second part 20 is located in the central region of the electronic device 100. When the first part 10 and the second part 20 are in the closed state, a distance between the frame 101 of the first part 10 and the frame 201 of the second part 20 in a thickness direction of the electronic device 100 is approximately 1 millimeter.

It can be learned from FIG. 4 and FIG. 5 that in a higher frequency band part (near 900 MHz) in a low frequency band, low-frequency performance of the first feeding antenna 11 in the closed state and the open state of the first part 10 and the second part 20 is similar. However, in a lower frequency band part (700 MHz to 800 MHz) in the low frequency band, low-frequency performance of the first feeding antenna 11 in the closed state of the first part 10 and the second part 20 is significantly lower than low-frequency performance of the first feeding antenna 11 in the open state of the first part 10 and the second part 20.

In addition, in addition to the low frequency band, when the first feeding antenna 11 is a medium- and high-frequency antenna (1700 MHz to 2700 MHz, for example, GPS, Wi-Fi, and LTE B3, B1, and B7), performance of the first feeding antenna 11 also decreases to different extents due to a length change of the ground plane 70 and impact of overlapping of the frame 101 of the first part 10 and the frame 201 of the second part 20 when the first part 10 and the second part 20 are in the closed state.

Figure 6:
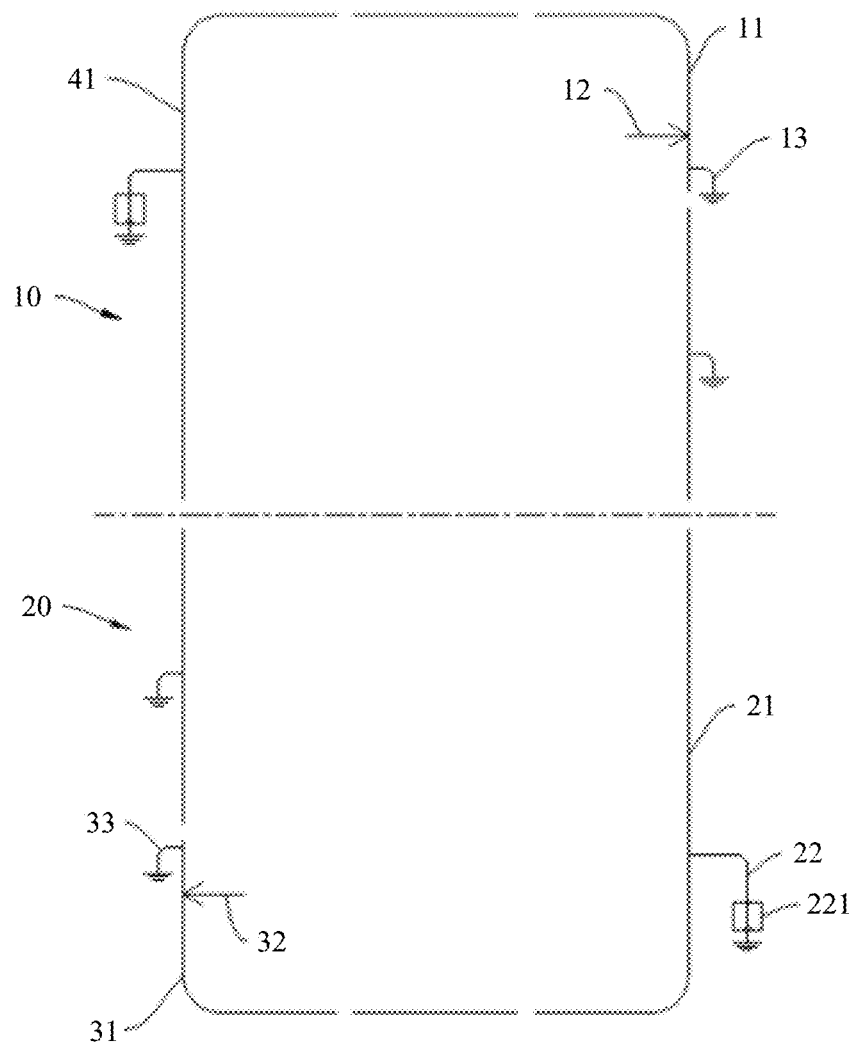
FIG. 6 is a schematic diagram of an antenna architecture of the electronic device shown in FIG. 1 in an embodiment.
Figure 7:
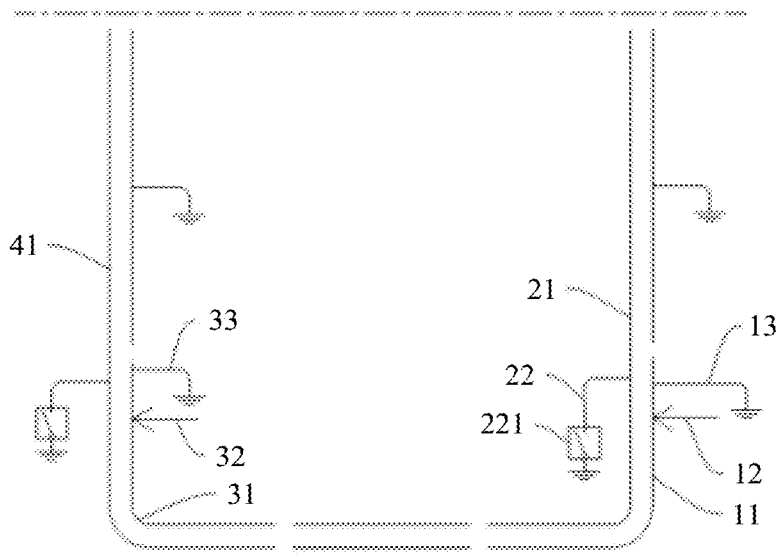
FIG. 7 is a schematic diagram of the antenna architecture shown in FIG. 6 when an electronic device is in another use state.

FIG. 6 is a schematic diagram of an antenna architecture of the electronic device shown in FIG. 1 in an embodiment, and FIG. 7 is a schematic diagram of the antenna architecture shown in FIG. 6 when an electronic device is in another use state. FIG. 6 corresponds to a structure when the first part 10 and the second part 20 are in the open state, and FIG. 7 corresponds to a structure when the first part 10 and the second part 20 are in the closed state. An antenna located above a dash dot line in FIG. 6 is located in the first part 10, and an antenna located below the dash dot line is located in the second part 20. In FIG. 7, because the antennas in the first part 10 and the second part 20 overlap in the closed state, the antennas in the first part 10 and the second part 20 are illustrated through staggering, so that the antenna in the first part 10 is located on an outer side of the antenna located in the second part 20.

The first part 10 includes a first feeding antenna 11, a first feeding circuit 12, and a first grounding circuit 13. The first feeding circuit 12 is connected to the first feeding antenna 11, and is configured to feed the first feeding antenna 11. The first grounding circuit 13 is connected to the first feeding antenna 11, and is configured to enable the first feeding antenna 11 to be grounded. For example, as shown in FIG. 6, the first grounding circuit 13 is connected to one end of the first feeding antenna 11, and is configured to enable the first feeding antenna 11 to be grounded. The end of the first feeding antenna 11 that is connected to the first grounding circuit 13 is a grounding end. The other end of the first feeding antenna 11 is an ungrounded open end. A connection position of the first feeding circuit 12 on the first feeding antenna 11 is located between a connection position of the first grounding circuit 13 on the first feeding antenna 11 and the open end of the first feeding antenna 11. In this case, an electrical length of the first feeding antenna 11 is ¼ wavelength, in other words, the first feeding antenna 11 is a ¼ wavelength antenna.

The second part 20 includes a first parasitic antenna 21. When the first part 10 and the second part 20 are in the closed state, the first parasitic antenna 21 is not grounded and can be coupled to the first feeding antenna 11 to generate a first excited resonance signal through excitation. In this case, an electrical length of the first parasitic antenna 21 is ½ wavelength, in other words, the first parasitic antenna 21 is a ½ wavelength antenna. There may be one or more first excited resonance signals.

In an embodiment, when the first part 10 and the second part 20 are in the closed state, the first parasitic antenna 21 and the first feeding antenna 11 are at least disposed partially opposite to each other to generate a coupling capacitor between the first parasitic antenna 21 and the first feeding antenna 11, so that the first excited resonance signal can be generated through coupling and excitation. When the first feeding antenna 11 works, radio frequency energy of the first feeding antenna 11 is transmitted to the first parasitic antenna 21 through coupling, so that an additional resonance mode is generated through excitation on the first parasitic antenna 21, radiating frequency bandwidth of the antenna is extended, adverse impact on antenna performance that is caused by a reduction of the length of the ground plane 70 and frame overlap in the closed state is reduced, and antenna performance of the electronic device 100 is improved, that is, the electronic device 100 has relatively high antenna performance in the closed state.

When the first parasitic antenna 21 is not grounded, the electrical length of the first parasitic antenna 21 is ½ wavelength, and the reduction in the length of the ground plane 70 during folding has relatively weak impact on performance of the first parasitic antenna 21, so that the first parasitic antenna 21 can maintain good radiation performance when the first part 10 and the second part 20 are in the closed state, thereby effectively extending radiating frequency bandwidth of the first feeding antenna 11.

Figure 8:
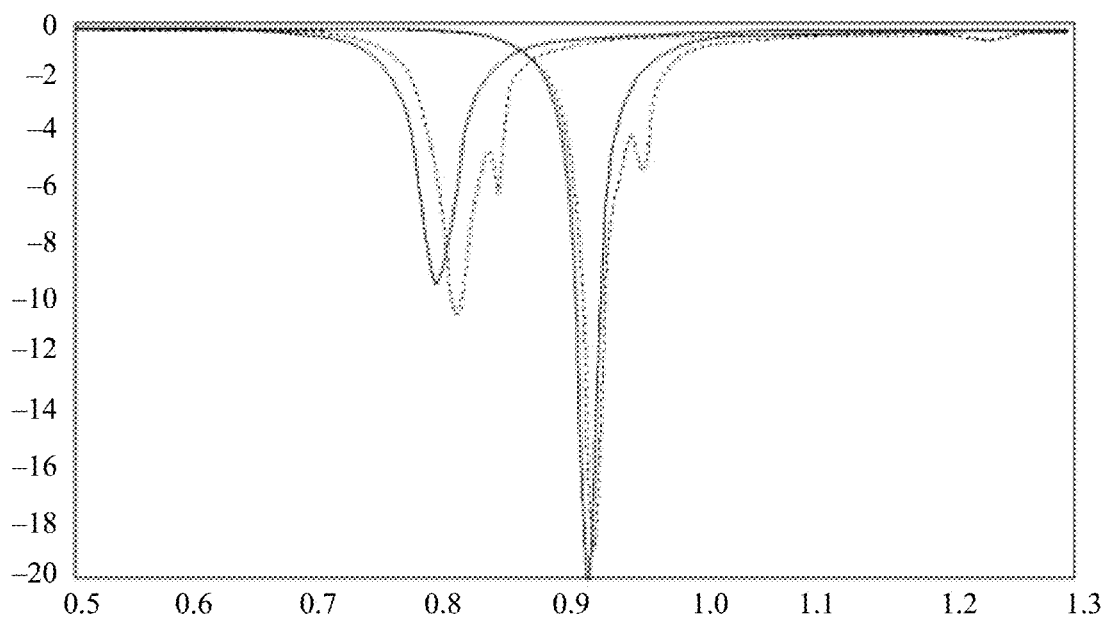
FIG. 8 is a reflection coefficient line graph of an example structure of the antenna architecture shown in FIG. 6.
Figure 9:
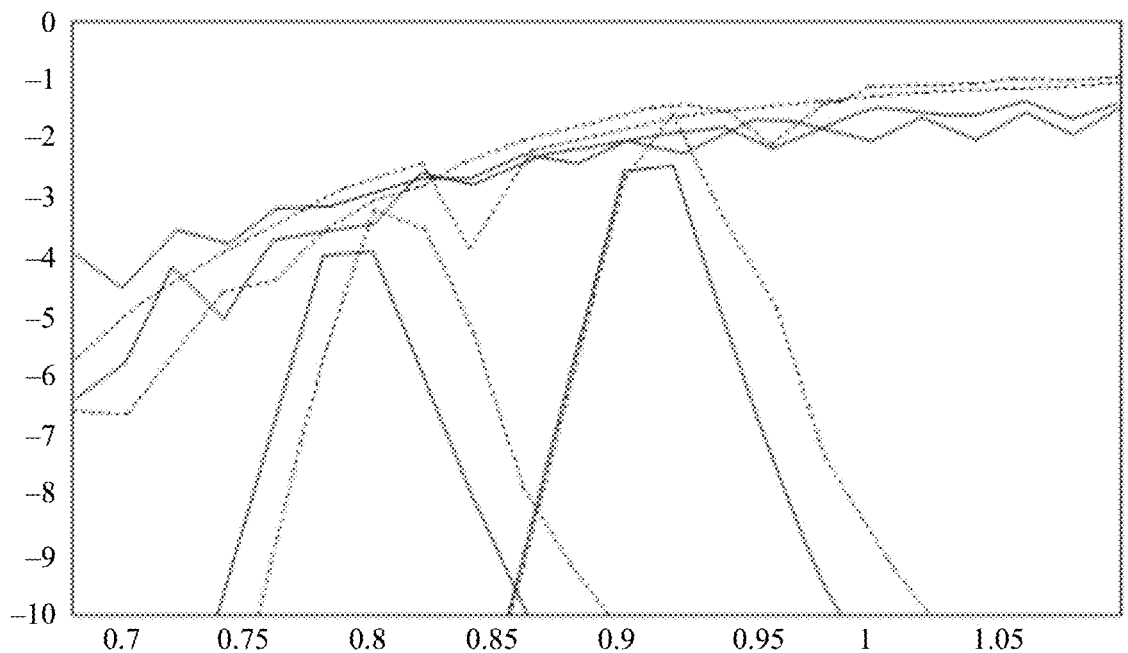
FIG. 9 is an efficiency line graph of an example structure of the antenna architecture shown in FIG. 6.
Figure 10:
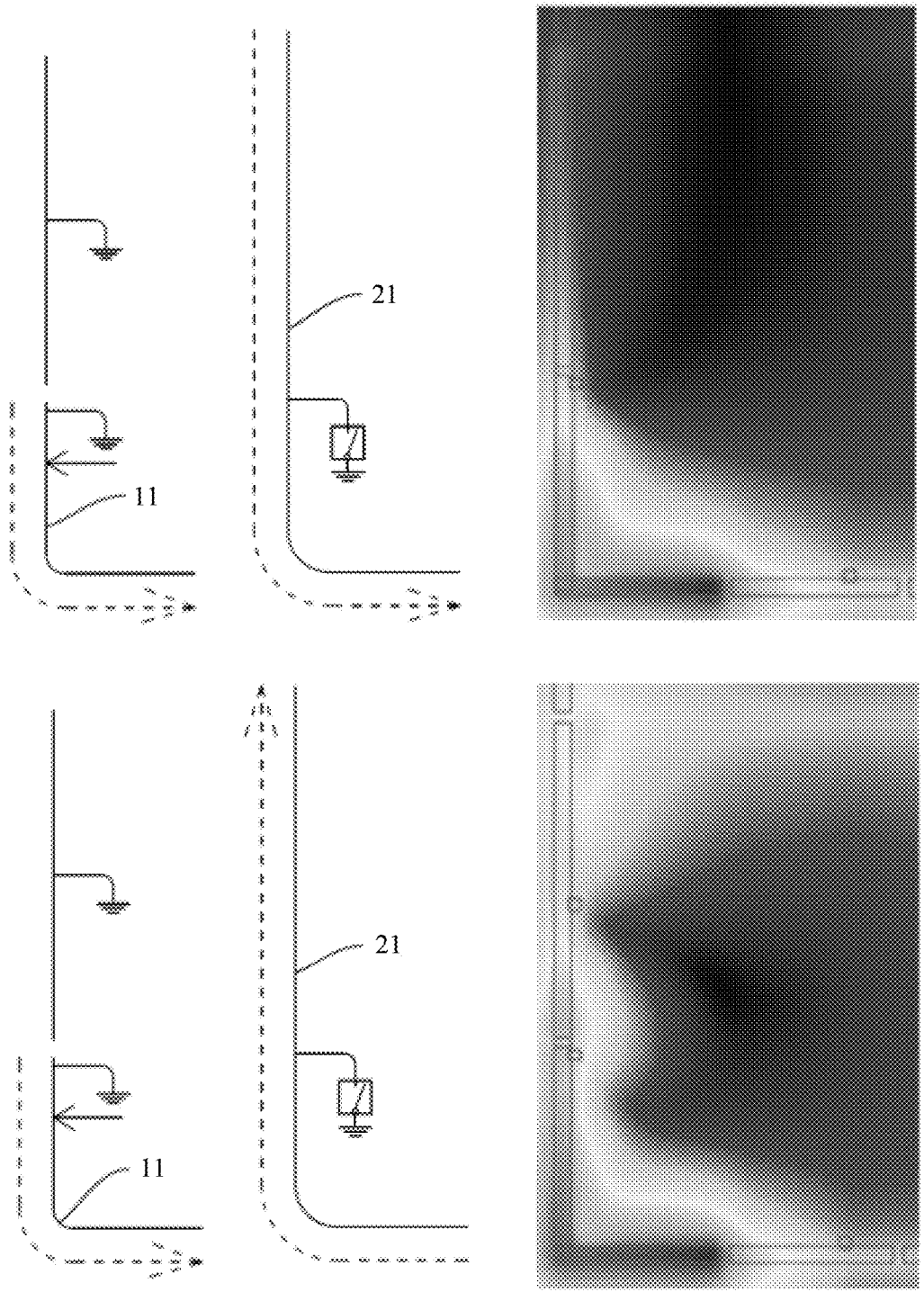
FIG. 10 is a simulation diagram of a current and an electric field in an example structure of the antenna architecture shown in FIG. 6.

For example, FIG. 8 is a reflection coefficient line graph of an example structure of the antenna architecture shown in FIG. 6, FIG. 9 is an efficiency line graph of an example structure of the antenna architecture shown in FIG. 6, and FIG. 10 is a simulation diagram of a current and an electric field in an example structure of the antenna architecture shown in FIG. 6. FIG. 8 and FIG. 9 illustrate comparison results of the first feeding antenna 11 (¼ wavelength antenna) in two frequency bands: low-band LTE B20 (791 MHz to 862 MHz) and LTE B8 (880 MHz to 960 MHz). In FIG. 8 and FIG. 9, solid lines represent performance when the first feeding antenna 11 (¼ wavelength antenna) is not coupled to the first parasitic antenna 21 and the first part 10 and the second part 20 are in the closed state, and dotted lines represent performance when the first feeding antenna 11 (¼ wavelength antenna) is coupled to the first parasitic antenna 21 (½ wavelength antenna) and the first part 10 and the second part 20 are in the closed state. In FIG. 8, a horizontal coordinate represents a frequency (in a unit of GHz), and a vertical coordinate represents a reflection coefficient (in a unit of dB). In FIG. 9, a horizontal coordinate represents a frequency (in a unit of GHz), and a vertical coordinate represents efficiency (in a unit of dB). FIG. 10 is a simulation diagram of a current and an electric field in low-band LTE B20 (791 MHz to 862 MHz) when the first feeding antenna 11 (¼ wavelength antenna) is coupled to the first parasitic antenna 21 (½ wavelength antenna).

In the example structures corresponding to FIG. 8 to FIG. 10, the first feeding antenna 11 is a frame antenna in a form of an inverted F-shaped antenna. The first parasitic antenna 21 is a frame antenna. When the first part 10 and the second part 20 are in the open state, the first feeding antenna 11 is located in an upper right corner of the electronic device 100, and the first parasitic antenna 21 is located in a lower right corner of the electronic device 100. A frame thickness and width of the electronic device 100 are approximately 4 millimeters and 3 millimeters, respectively. A width of a clearance area between the frame of the electronic device 100 and the ground plane 70 is approximately 1 millimeter. A gap width between two adjacent metal segments in the frame of the electronic device 100 is approximately 1.5 millimeters. A dielectric constant and a loss angle of an insulating material used for an insulation segment between two adjacent metal segments and an insulating material filled in the clearance area between the frame of the electronic device 100 and the ground plane 70 are 3.0 and 0.01, respectively. The rotation part 50 of the first part 10 and the second part 20 is located in the central region of the electronic device 100. When the first part 10 and the second part 20 are in the closed state, a distance between the frame 101 of the first part 10 and the frame 201 of the second part 20 in a thickness direction of the electronic device 100 is approximately 1 millimeter.

It can be learned from FIG. 8 and FIG. 9 that, in the low frequency band, when the first feeding antenna 11 is coupled to the first parasitic antenna 21, the first excited resonance signal generated by the first parasitic antenna 21 extends bandwidth of the first feeding antenna 11, and reduces adverse impact on antenna performance of the first feeding antenna 11 that is caused by the reduction of the length of the ground plane 70 and frame overlap in the closed state, so that antenna performance of the first feeding antenna 11 is better. It can be learned from FIG. 8 and FIG. 9 that, in the low frequency band, the first excited resonance signal generated by the first parasitic antenna 21 is adjacent to the resonance generated by the first feeding antenna 11.

In FIG. 10, the first to the third diagrams in the first row respectively represent a schematic diagram of a current of the first feeding antenna 11, a schematic diagram of a current of the first parasitic antenna 21, and a schematic diagram of an electric field when the first feeding antenna 11 is coupled to the first parasitic antenna 21 when the first part 10 and the second part 20 are in the closed state in a frequency band of 810 MHz, and the first to the third diagrams in the second row respectively represent a schematic diagram of a current of the first feeding antenna 11, a schematic diagram of a current of the first parasitic antenna 21, and a schematic diagram of an electric field when the first feeding antenna 11 is coupled to the first parasitic antenna 21 when the first part 10 and the second part 20 are in the closed state in a frequency band of 840 MHz. It can be learned from FIG. 10 that a resonance of a relatively low frequency in FIG. 8 is generated by the first feeding antenna 11, and a resonance of a relatively high frequency is generated by the first parasitic antenna 21, and is named the first excited resonance signal.

In an embodiment, the first parasitic antenna 21 may have a plurality of structural forms. For example, the first parasitic antenna 21 is a part of the frame 201 of the second part 20 of the electronic device 100, or is fastened to an inner side of the frame 201 of the second part 20. In this embodiment, an example in which the first parasitic antenna 21 is a part of the frame 201 of the second part 20 is used for description. The frame 201 of the first part 20 includes at least two metal segments and at least one insulation segment for electrically isolating the at least two metal segments. The first parasitic antenna 21 may be formed in one of the metal segments. In another embodiment, the first parasitic antenna 21 is fastened to the inner side of the frame 201 of the second part 20. In this case, a structural form of the first parasitic antenna 21 may be a flexible circuit board, a laser direct structuring (LDS) metal, an insert molding metal, or a wire of a printed circuit board.

Further referring to FIG. 6, in an embodiment, a matching circuit may be further disposed between the first feeding circuit 12 and the first feeding antenna 11, and the matching circuit is configured to match feature impedance. The matching circuit may include at least one circuit component. For example, the matching circuit may include at least one of a resistor, an inductor, or a capacitor used as lumped elements. For example, the matching circuit may include at least one of a microstrip and a strip used as distribution elements.

Further referring to FIG. 6 and FIG. 7, in an embodiment, the second part 20 further includes a second feeding antenna 31. The second feeding antenna 31 is electrically isolated from the first parasitic antenna 21. When the first part 10 and the second part 20 are in the open state, the first parasitic antenna 21 can be coupled to the second feeding antenna 31 to generate a second excited resonance signal through excitation. There may be one or more second excited resonance signals.

In an embodiment, when the first part 10 and the second part 20 are in the open state, the first parasitic antenna 21 can be coupled to the second feeding antenna 31, and a coupling capacitor is generated between the first parasitic antenna 21 and the second feeding antenna 31, so that the second excited resonance signal can be generated through coupling and excitation. When the second feeding antenna 31 works, radio frequency energy of the second feeding antenna 31 is transmitted to the first parasitic antenna 21 through coupling, so that an additional resonance mode is generated through excitation on the first parasitic antenna 21, thereby extending radiating frequency bandwidth of the antenna and improving antenna performance of the electronic device 100. Because the first parasitic antenna 21 can be coupled to the first feeding antenna 11 when the first part 10 and the second part 20 are in the closed state, and can be coupled to the second feeding antenna 31 when the first part 10 and the second part 20 are in the open state, the electronic device 100 can multiplex the first parasitic antenna 21, so that antenna utilization is improved.

In an embodiment, when the first part 10 and the second part 20 are in the open state, the first feeding antenna 11, the second feeding antenna 31, and the first parasitic antenna 21 are located in different corner regions of the electronic device 100. In this case, the first feeding antenna 11 and the second feeding antenna 31 may work in close frequency bands, and the first feeding antenna 11 and the second feeding antenna 31 have relatively large space and a relatively low degree of mutual interference. The first parasitic antenna 21 may also be better separately coupled to the first feeding antenna 11 and the second feeding antenna 31 in the two states.

In an embodiment, the second part 20 further includes a second feeding circuit 32 and a second grounding circuit 33. The second grounding circuit 33 is connected to one end of the second feeding antenna 31, and is configured to enable the second feeding antenna 31 to be grounded. The end of the second feeding antenna 31 that is connected to the second grounding circuit 33 is a grounding end. The other end (that is, one end away from the grounding end) of the second feeding antenna 31 is an ungrounded open end. The second feeding circuit 32 is connected to the second feeding antenna 31. The second feeding circuit 32 is configured to feed the second feeding antenna 31. A connection position of the second feeding circuit 32 on the second feeding antenna 31 is located between a connection position of the second grounding circuit 33 on the second feeding antenna 31 and the open end of the second feeding antenna 31. In this case, the second feeding antenna 31 is a grounded ¼ wavelength antenna. When the first part 10 and the second part 20 are in the open state, the first parasitic antenna 21 is grounded. In this case, an electrical length of the first parasitic antenna 21 is ¼ wavelength, in other words, the first parasitic antenna 21 is a ¼ wavelength antenna. The electrical length of the first parasitic antenna 21 is adjustable, so that there can be different electrical lengths in different use environments.

In an embodiment, a coupling effect between the first parasitic antenna 21 and the second feeding antenna 31 is excellent, and bandwidth of the second feeding antenna 31 can be extended to a relatively large extent. To improve the coupling effect, for example, an end of the second feeding antenna 31 that is away from the first parasitic antenna 21 is a grounding end, and an end of the second feeding antenna 31 that is close to the first parasitic antenna 21 is an open end.

Figure 11:
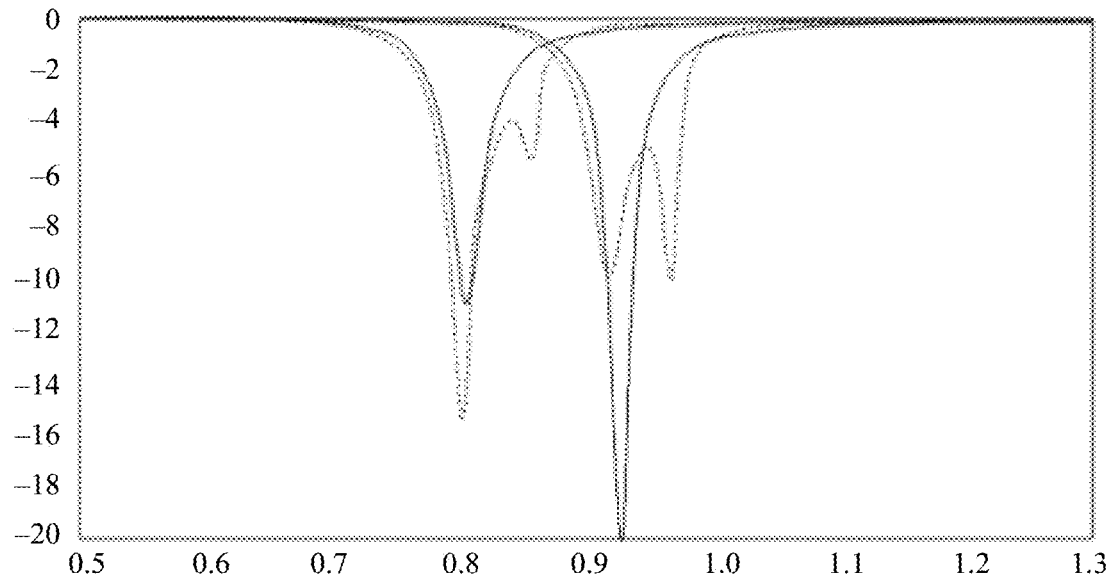
FIG. 11 is a reflection coefficient line graph of another example structure of the antenna architecture shown in FIG. 6.
Figure 12:
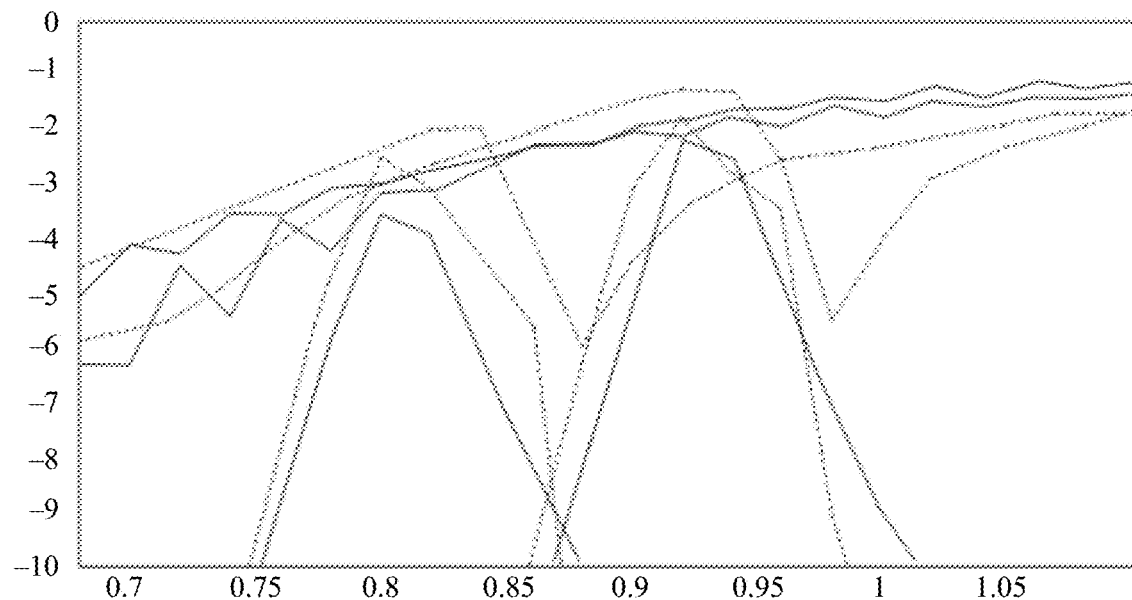
FIG. 12 is an efficiency line graph of another example structure of the antenna architecture shown in FIG. 6.

For example, FIG. 11 is a reflection coefficient line graph of another example structure of the antenna architecture shown in FIG. 6, and FIG. 12 is an efficiency line graph of another example structure of the antenna architecture shown in FIG. 6. FIG. 11 and FIG. 12 illustrate comparison results of the second feeding antenna 31 (¼ wavelength antenna) in two frequency bands: low-band LTE B20 (791 MHz to 862 MHz) and LTE B8 (880 MHz to 960 MHz). In FIG. 11 and FIG. 12, solid lines represent performance when the second feeding antenna 31 is not coupled to the first parasitic antenna 21 and the first part 10 and the second part 20 are in the open state, and dotted lines represent performance when the second feeding antenna 31 is coupled to the first parasitic antenna 21 (½ wavelength antenna) and the first part 10 and the second part 20 are in the open state. In FIG. 11, a horizontal coordinate represents a frequency (in a unit of GHz), and a vertical coordinate represents a reflection coefficient (in a unit of dB). In FIG. 12, a horizontal coordinate represents a frequency (in a unit of GHz), and a vertical coordinate represents efficiency (in a unit of dB).

In the example structures corresponding to FIG. 11 and FIG. 12, the second feeding antenna 31 is a frame antenna in a form of an inverted F-shaped antenna. The first parasitic antenna 21 is a frame antenna. When the first part 10 and the second part 20 are in the open state, the second feeding antenna 31 is located in a lower left corner of the electronic device 100, and the first parasitic antenna 21 is located in a lower right corner of the electronic device 100. A frame thickness and width of the electronic device 100 are approximately 4 millimeters and 3 millimeters, respectively. A width of a clearance area between the frame of the electronic device 100 and the ground plane 70 is approximately 1 millimeter. A gap width between two adjacent metal segments in the frame of the electronic device 100 is approximately 1.5 millimeters. A dielectric constant and a loss angle of an insulating material used for an insulation segment between two adjacent metal segments and an insulating material filled in the clearance area between the frame of the electronic device 100 and the ground plane 70 are 3.0 and 0.01, respectively. The rotation part 50 of the first part 10 and the second part 20 is located in the central region of the electronic device 100. When the first part 10 and the second part 20 are in the closed state, a distance between the frame 101 of the first part 10 and the frame 201 of the second part 20 in a thickness direction of the electronic device 100 is approximately 1 millimeter.

It can be learned from FIG. 11 and FIG. 12 that, in the low frequency band, when the second feeding antenna 31 is coupled to the first parasitic antenna 21, the second excited resonance signal generated by the first parasitic antenna 21 extends bandwidth of the second feeding antenna 31, so that antenna performance of the second feeding antenna 31 is better. It can be learned from FIG. 11 and FIG. 12 that, in the low frequency band, the second excited resonance signal generated by the first parasitic antenna 21 is adjacent to the resonance generated by the second feeding antenna 31.

Further referring to FIG. 6, in an embodiment, a matching circuit may be further disposed between the second feeding circuit 32 and the second feeding antenna 31, and the matching circuit is configured to match feature impedance. The matching circuit may include at least one circuit component. For example, the matching circuit may include at least one of a resistor, an inductor, or a capacitor used as lumped elements. For example, the matching circuit may include at least one of a microstrip and a strip used as distribution elements.

It may be understood that when a parasitic antenna is not grounded, an electrical length of the parasitic antenna is N/2 wavelength, where N is a positive integer. When a parasitic antenna is grounded, an electrical length of the parasitic antenna is M/4 wavelength, where M is a positive odd number.

In another embodiment, when the first part 10 and the second part 20 are in the open state, the first parasitic antenna 21 may also be grounded (in other words, the first parasitic antenna 21 is a ½ wavelength antenna). In this case, a coupling effect between the first parasitic antenna 21 and the second feeding antenna 31 is poorer than that in the foregoing embodiment, but bandwidth of the second feeding antenna 31 can still be extended.

In an embodiment, as shown in FIG. 6, the second part 20 further includes a switching circuit 22. One end of the switching circuit 22 is connected to the first parasitic antenna 21, and the other end is grounded. The switching circuit 22 is configured to connect the first parasitic antenna 21 to the ground or disconnect the first parasitic antenna 21 from the ground, so that the electrical length of the first parasitic antenna 21 is adjustable. For example, the switching circuit 22 is configured to disconnect the first parasitic antenna 21 from the ground when the first part 10 and the second part 20 are in the closed state. In this case, the electrical length of the first parasitic antenna 21 is ½ wavelength. The switching circuit 22 is further configured to connect the first parasitic antenna 21 to the ground when the first part 10 and the second part 20 are in the open state. In this case, the electrical length of the first parasitic antenna 21 is ¼ wavelength.

In this embodiment, by disposing the switching circuit 22, the electrical length of the first parasitic antenna 21 is adjustable, and the first parasitic antenna 21 can implement different coupling functions when the electronic device 100 is in different use states, so that the antenna is multiplexed.

For example, the switching circuit 22 may include a tuning switch 221. The switching circuit 22 switches a connection relationship between the first parasitic antenna 21 and the ground by switching the tuning switch 221 between a closed state and an open state, so that the electrical length of the first parasitic antenna 21 is adjustable. For example, the tuning switch 221 may be roughly connected to a middle part of the first parasitic antenna 21. In an embodiment, a middle part of an antenna includes a central location and another location that slightly deviates from the central location, and the middle part of the antenna is located between both ends of the antenna. The middle part of the first parasitic antenna 21 is located between both ends of the first parasitic antenna 21.

For another example, the switching circuit 22 may include a tuning switch, a first matching branch, and a second matching branch. The first matching branch is different from the second matching branch. A control end of the tuning switch is connected to the first parasitic antenna 21, and two selection ends of the tuning switch are connected to the first matching branch and the second matching branch. The switching circuit 22 switches a connection relationship between the first parasitic antenna 21 and the ground by switching a connection between the first matching branch and the second matching branch by using the control end of the tuning switch, so that the electrical length of the first parasitic antenna 21 is adjustable.

The tuning switch 221 of the switching circuit 22 is electrically connected to the processor 40. The processor 40 controls a switching status of the tuning switch 221 based on a sensing signal of the sensing apparatus 30, so that the switching circuit 22 can accurately adjust the electrical length of the first parasitic antenna 21 based on a status of the first part 10 and the second part 20. In this way, antenna performance of the electronic device 100 is more reliable.

In an embodiment, as shown in FIG. 6, the first part 10 further includes a second parasitic antenna 41. When the first part 10 and the second part 20 are in the closed state, the second parasitic antenna 41 is not grounded and can be coupled to the second feeding antenna 31 to generate a third excited resonance signal through excitation. In this case, the second parasitic antenna 41 is a ½ wavelength antenna. When the first part 10 and the second part 20 are in the open state, the second parasitic antenna 41 may be located in an upper left corner of the electronic device 100. The second parasitic antenna 41, the first feeding antenna 11, the second feeding antenna 31, and the first parasitic antenna 21 are located in different corner regions of the electronic device 100. When the first part 10 and the second part 20 are in the open state, the second parasitic antenna 41 can be coupled to the first feeding antenna 11 to generate a fourth excited resonance signal through excitation. In this case, the second parasitic antenna 41 may be grounded. For structural design of the second parasitic antenna 41, refer to the first parasitic antenna 21. For example, the first part 10 may also include a switching circuit (refer to the switching circuit 22) connected between the second parasitic antenna 41 and the ground. In another embodiment, when the first part 10 and the second part 20 are in the open state, the second parasitic antenna 41 may be ungrounded and coupled to the first feeding antenna 11.

In an embodiment, in the antenna architecture shown in FIG. 6, the switching circuit 22 and a physical length of a metal segment in which the first parasitic antenna 21 is located may be designed, so that the first parasitic antenna 21 is switched between a grounded state and an ungrounded state, in other words, the electrical length of the first parasitic antenna 21 is switched between ½ wavelength and ¼ wavelength. When the foregoing design is difficult to meet an adjustment requirement of the electrical length of the first parasitic antenna 21, one or more tuning circuits may be connected to the first parasitic antenna 21, so that the electrical length of the first parasitic antenna 21 meets the adjustment requirement through coordination of the one or more tuning circuits.

Figure 13:
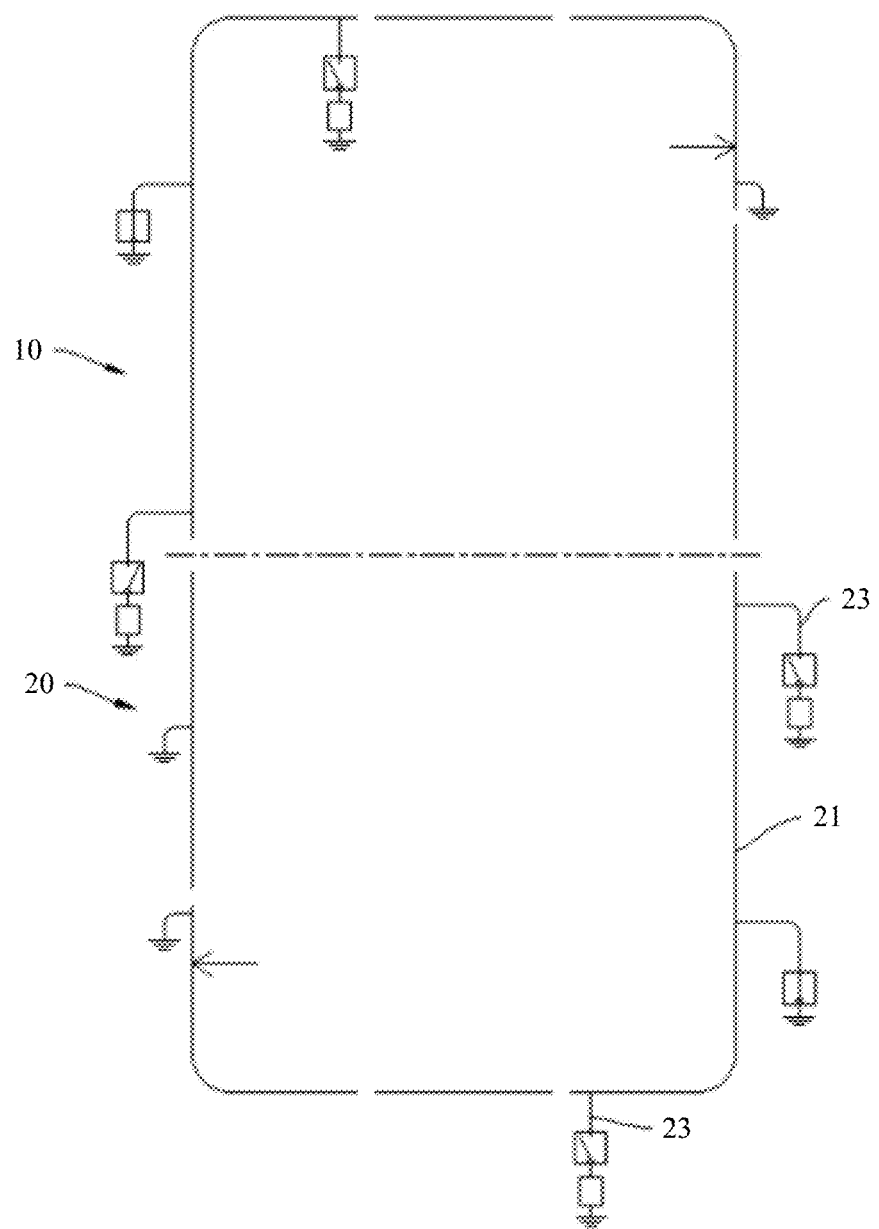
FIG. 13 is a schematic diagram of an antenna architecture of the electronic device shown in FIG. 1 in another embodiment.

For example, FIG. 13 is a schematic diagram of an antenna architecture of the electronic device shown in FIG. 1 in another embodiment. Most technical content of the antenna architecture shown in this embodiment that is the same as that of the antenna architecture shown in the foregoing embodiment is not described again.

The second part 20 further includes one or more first tuning circuits 23. The one or more first tuning circuits 23 are connected to the first parasitic antenna 21. The first tuning circuit 23 is configured to adjust the electrical length of the first parasitic antenna 21. The one or more first tuning circuits 23 may be connected to an end of the first parasitic antenna 21, to better perform a tuning function. For example, the second part 20 includes two first tuning circuits 23, and the two first tuning circuits 23 are separately connected to both ends of the first parasitic antenna 21. Certainly, in another embodiment, a connection position of the one or more first tuning circuits 23 on the first parasitic antenna 21 may be in another manner. This is not strictly limited in this disclosure.

The first tuning circuit 23 may include one or more of a switch, a capacitor, an inductor, or a low-pass high-cut filter. A specific structure of the first tuning circuit 23 is not strictly limited in this disclosure.

Figure 14:
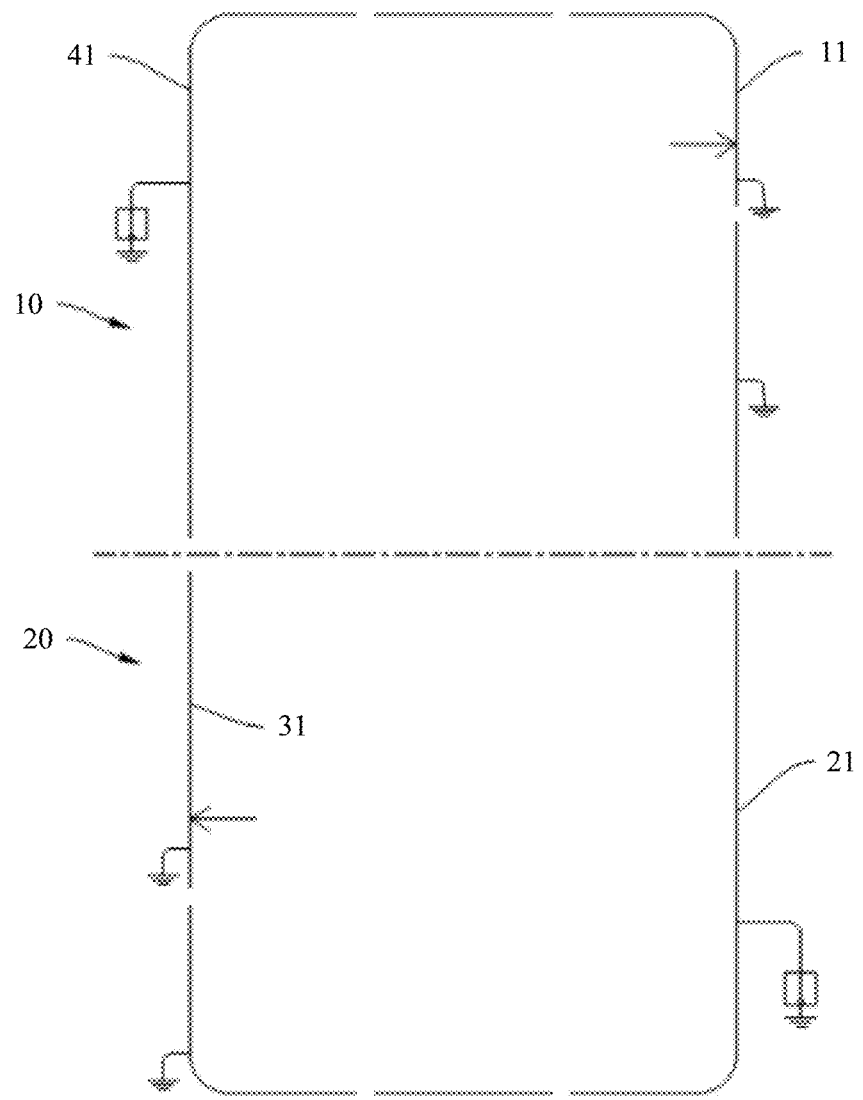
FIG. 14 is a schematic diagram of an antenna architecture of the electronic device shown in FIG. 1 in another embodiment.

FIG. 14 is a schematic diagram of an antenna architecture of the electronic device shown in FIG. 1 in another embodiment. Most technical content of the antenna architecture shown in this embodiment that is the same as that of the antenna architecture shown in the foregoing embodiment is not described again.

In an embodiment, the second feeding antenna 31 is located in a side edge region, instead of a corner region, of the second part 20, and when the first part 10 and the second part 20 are in the closed state, the second parasitic antenna 41 located in the corner region can also be coupled to the second feeding antenna 31. In an embodiment, because the second feeding antenna 31 is relatively away from the first parasitic antenna 21, the second feeding antenna 31 is no longer coupled to the first parasitic antenna 21.

Similarly, in some examples, the first feeding antenna 11 may also be located in a side edge region of the first part 10. When the first part 10 and the second part 20 are in the closed state, the first parasitic antenna 21 located in a corner region can be coupled to the first feeding antenna 11. The first feeding antenna 11 is no longer coupled to the second parasitic antenna 41. In this example, when the first part 10 and the second part 20 are in the open state, the first feeding antenna 11 and the second feeding antenna 31 may be located on both sides of the electronic device 100, so that both the first feeding antenna 11 and the second feeding antenna 31 have relatively sufficient radiation space.

Figure 15:
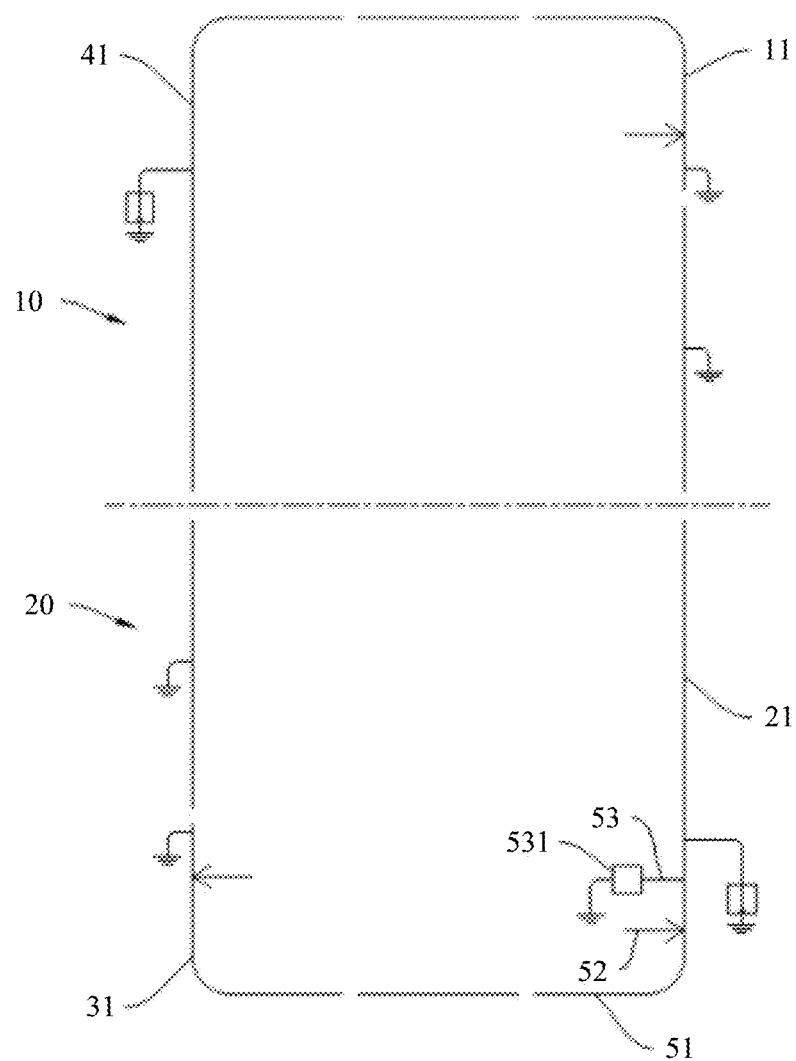
FIG. 15 is a schematic diagram of an antenna architecture of the electronic device shown in FIG. 1 in another embodiment.

FIG. 15 is a schematic diagram of an antenna architecture of the electronic device shown in FIG. 1 in another embodiment. Most technical content of the antenna architecture shown in this embodiment that is the same as that of the antenna architecture shown in the foregoing embodiment is not described again.

The second part 20 further includes a third feeding circuit 52 and a first filter circuit 53. The third feeding circuit 52 and the first filter circuit 53 are connected to different locations of the first parasitic antenna 21, and are configured to form a third feeding antenna 51 on the first parasitic antenna 21. A radiating frequency band of the third feeding antenna 51 is different from a radiating frequency band of the first feeding antenna 11. For example, the first feeding antenna 11 is a low-band antenna. The radiating frequency band of the third feeding antenna 51 is a wireless local area network antenna, a short-range wireless communications antenna, a medium- and high-band antenna, a sub 6G antenna (a frequency is less than 6 GHz), a wireless charging antenna, or the like. In this case, the first filter circuit 53 has a low-cut and high-pass feature. For example, the first filter circuit 53 includes a high-pass low-cut filter 531.

In this case, the third feeding antenna 51 and the first parasitic antenna 21 share a same segment of radiator, so that antenna utilization can be improved. In addition, because the radiating frequency band of the third feeding antenna 51 is different from the radiating frequency band of the first feeding antenna 11, the third feeding antenna 51 and the first feeding antenna 11 do not interfere with each other, and are well isolated.

Connection positions of the third feeding circuit 52 and the first filter circuit 53 on the first parasitic antenna 21 may be located between a connection position of the switching circuit 22 on the first parasitic antenna 21 and one end of the first parasitic antenna 21. For example, the first filter circuit 53 is closer to the middle part of the first parasitic antenna 21 than to an end of the first parasitic antenna 21. The connection position of the third feeding circuit 52 on the first parasitic antenna 21 is located between the connection position of the first filter circuit 53 on the first parasitic antenna 21 and an end of the first parasitic antenna 21.

Figure 16:
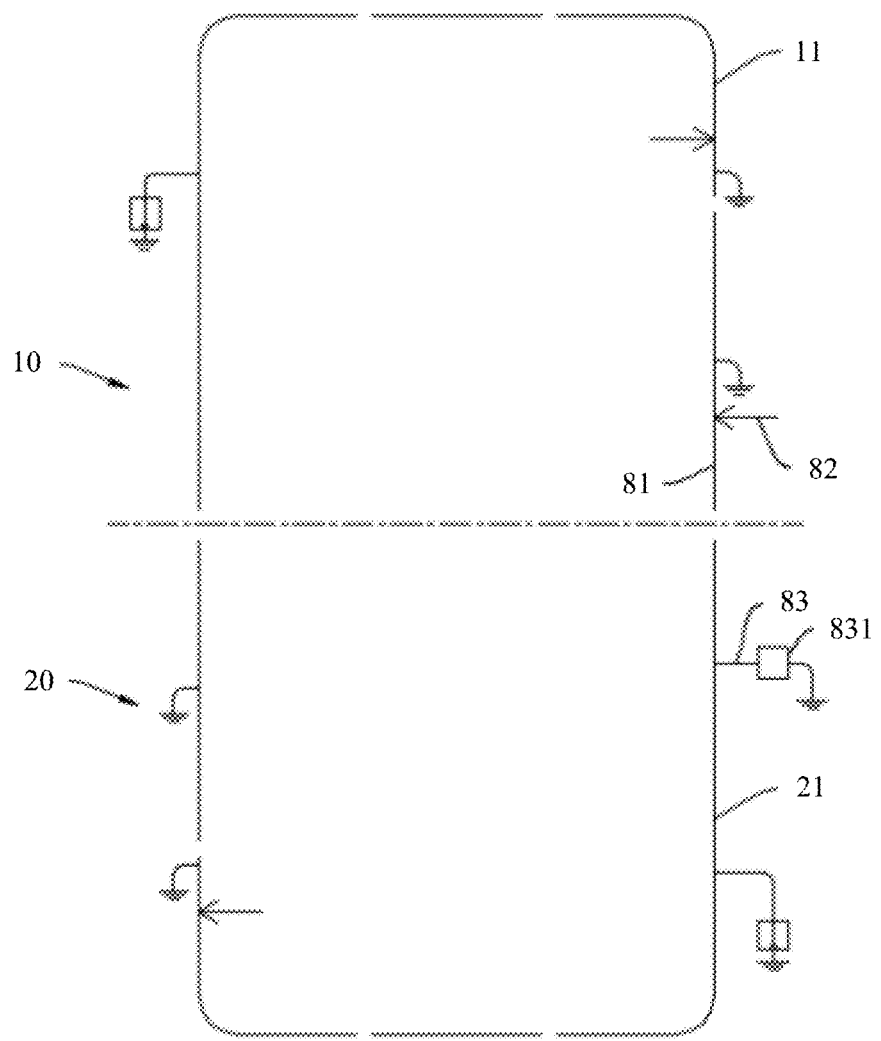
FIG. 16 is a schematic diagram of an antenna architecture of the electronic device shown in FIG. 1 in another embodiment.

For example, FIG. 16 is a schematic diagram of an antenna architecture of the electronic device shown in FIG. 1 in another embodiment. Most technical content of the antenna architecture shown in this embodiment that is the same as that of the antenna architecture shown in the foregoing embodiment is not described again.

The electronic device 100 further includes a fourth feeding antenna 81, a fourth feeding circuit 82, and a second filter circuit 83. The fourth feeding antenna 81 is adjacent to and electrically isolated from the first parasitic antenna 21. The fourth feeding circuit 82 is connected to the fourth feeding antenna 81. The fourth feeding circuit 82 is configured to feed the fourth feeding antenna 81. The second filter circuit 83 is connected to the first parasitic antenna 21. A radiating frequency band of the fourth feeding antenna 81 is different from the radiating frequency band of the first feeding antenna 11. For example, the first feeding antenna 11 is a low-band antenna. The radiating frequency band of the fourth feeding antenna 81 is a wireless local area network antenna, a short-range wireless communications antenna, a medium- and high-band antenna, a wireless charging antenna, or the like. In this case, the second filter circuit 83 has a low-cut and high-pass feature. For example, the second filter circuit 83 includes a high-pass low-cut filter 831.

In this case, a radiator part in which the first parasitic antenna 21 is located is used as a parasitic branch of the fourth feeding antenna 81 to implement multiplexing, so that antenna utilization can be improved. In addition, because the radiating frequency band of the fourth feeding antenna 81 is different from the radiating frequency band of the first feeding antenna 11, the fourth feeding antenna 81 and the first feeding antenna 11 do not interfere with each other, and are well isolated.

The fourth feeding antenna 81 may be located in the first part 10 or the second part 20. A connection position of the fourth feeding antenna 81 on the first parasitic antenna 21 is located between the connection position of the switching circuit 22 on the first parasitic antenna 21 and the fourth feeding antenna 81.

In another embodiment, the antenna architecture may further include more feeding antennas. These feeding antennas may use different radiators from the first feeding antenna 11, the first parasitic antenna 21, the second feeding antenna 31, the second parasitic antenna 22, and the like, or a same radiator may be multiplexed. This is not strictly limited in this disclosure.

Figure 17:
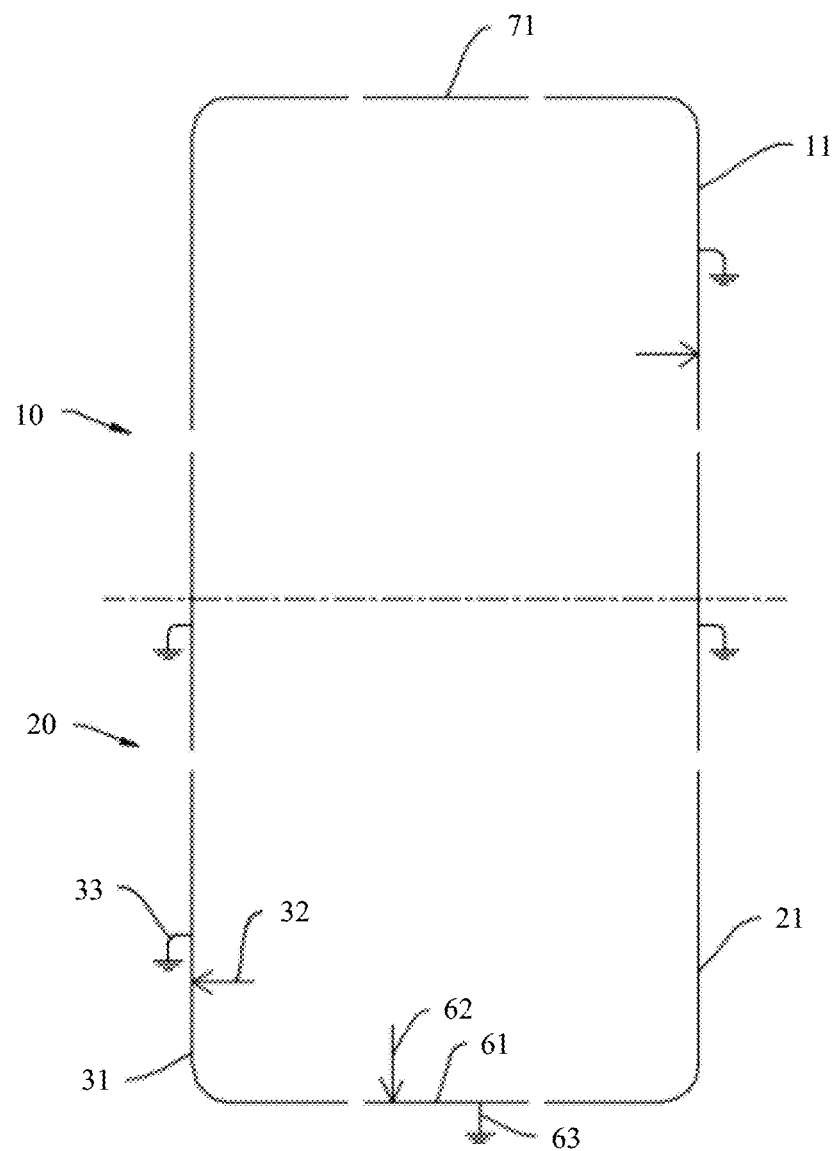
FIG. 17 is a schematic diagram of an antenna architecture of the electronic device shown in FIG. 1 in another embodiment.
Figure 18:
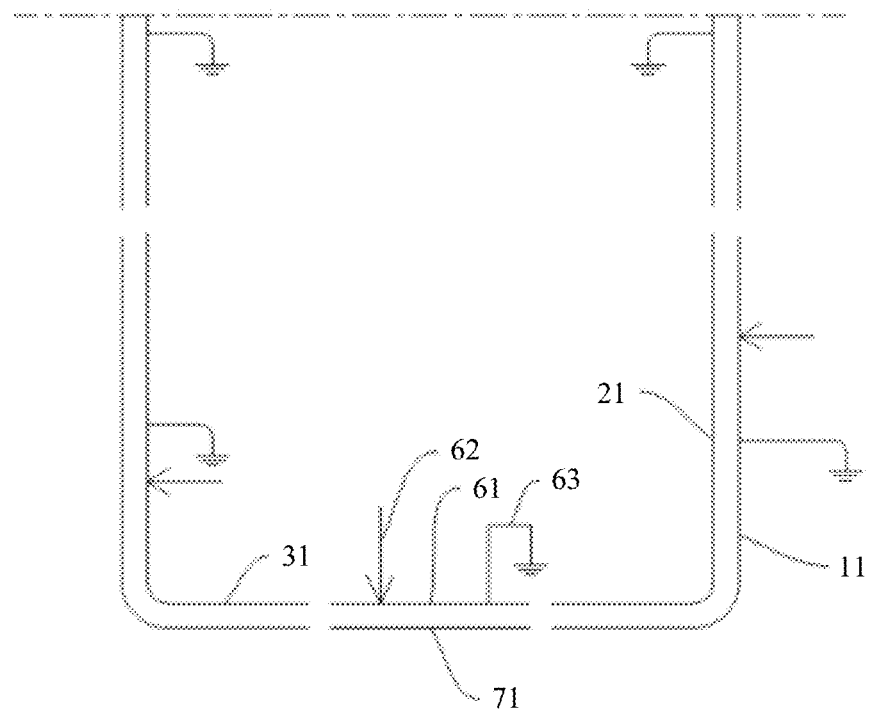
FIG. 18 is a schematic diagram of the antenna architecture shown in FIG. 17 in another use state.

FIG. 17 is a schematic diagram of an antenna architecture of the electronic device shown in FIG. 1 in another embodiment, and FIG. 18 is a schematic diagram of the antenna architecture shown in FIG. 17 in another use state. FIG. 17 corresponds to the open state of the first part 10 and the second part 20. FIG. 18 corresponds to the closed state of the first part 10 and the second part 20. In FIG. 18, because the antennas in the first part 10 and the second part 20 overlap in the closed state, the antennas in the first part 10 and the second part 20 are illustrated through staggering, so that the antenna in the first part 10 is located on an outer side of the antenna located in the second part 20. Most technical content of the antenna architecture shown in this embodiment that is the same as that of the antenna architecture shown in the foregoing embodiment is not described again.

The second part 20 includes a second feeding antenna 31, a second feeding circuit 32, and a second grounding circuit 33. The second feeding antenna 31 is electrically isolated from the first parasitic antenna 21. The second grounding circuit 33 is connected to a middle part of the second feeding antenna 31. Both ends of the second feeding antenna 31 are ungrounded open ends. The second feeding circuit 32 is connected to the second feeding antenna 31, and is configured to feed the second feeding antenna 31. A connection position of the second feeding circuit 32 on the second feeding antenna 31 is located between a connection position of the second grounding circuit 33 on the second feeding antenna 31 and an end of the second feeding antenna 31. In this case, the second feeding antenna 31 is a ½ wavelength antenna. The first parasitic antenna 21 is a floating antenna (floating antenna). In other words, the first parasitic antenna 21 is not grounded.

In an embodiment, when the first part 10 and the second part 20 are in the open state, the second feeding antenna 31 has two antenna modes, has relatively large bandwidth, and has relatively high antenna performance. Therefore, the second feeding antenna 31 may not be coupled to the first parasitic antenna 21. When the first part 10 and the second part 20 are in the closed state, the first feeding antenna 11 is coupled to the first parasitic antenna 21 of ½ wavelength, to improve antenna performance of the first feeding antenna 11 and reduce adverse impact of an external environment. In this case, for the antenna architecture, there is no need to switch between different antenna coupling forms when the first part 10 and the second part 20 are in different states, in other words, the first parasitic antenna 21 may be a single ½ wavelength antenna, and no switching circuit 22 needs to be disposed, so that a structure of the antenna architecture is simpler.

Figure 19:
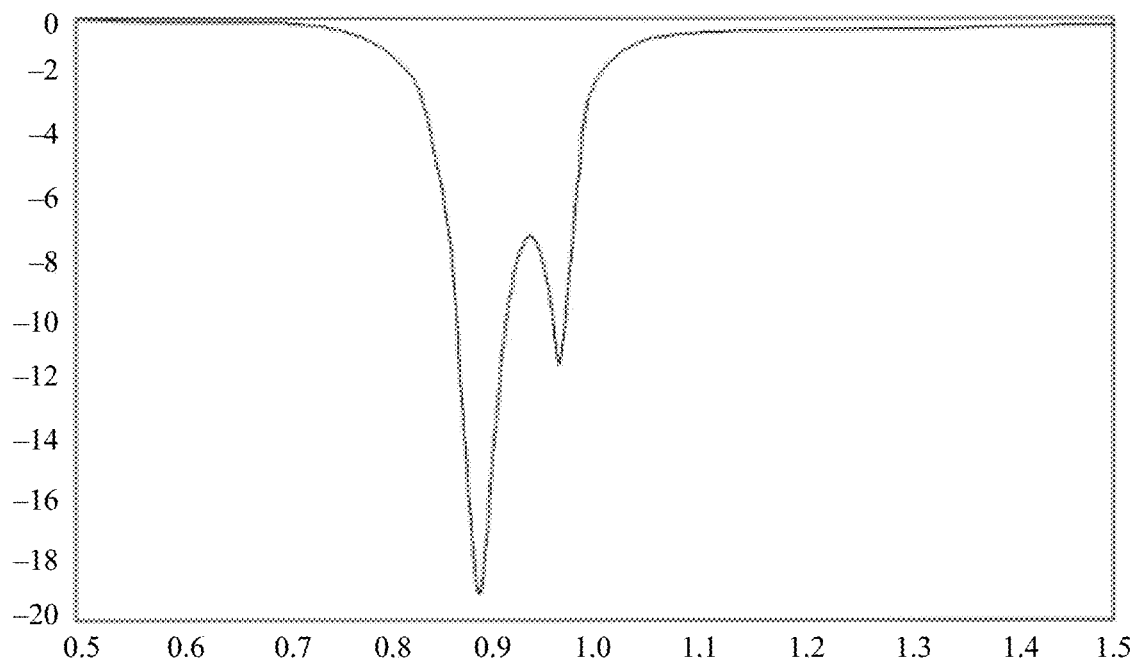
FIG. 19 is a reflection coefficient line graph of a second feeding antenna in an example structure of the antenna architecture shown in FIG. 17.
Figure 20:
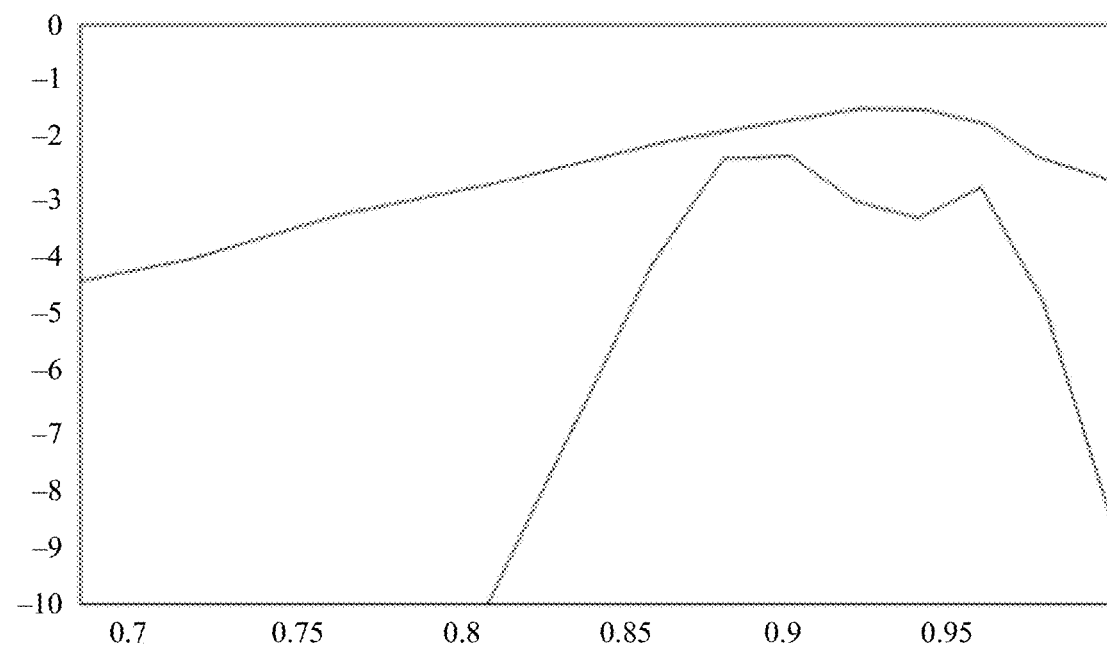
FIG. 20 is an efficiency line graph of a second feeding antenna in an example structure of the antenna architecture shown in FIG. 17.
Figure 21:
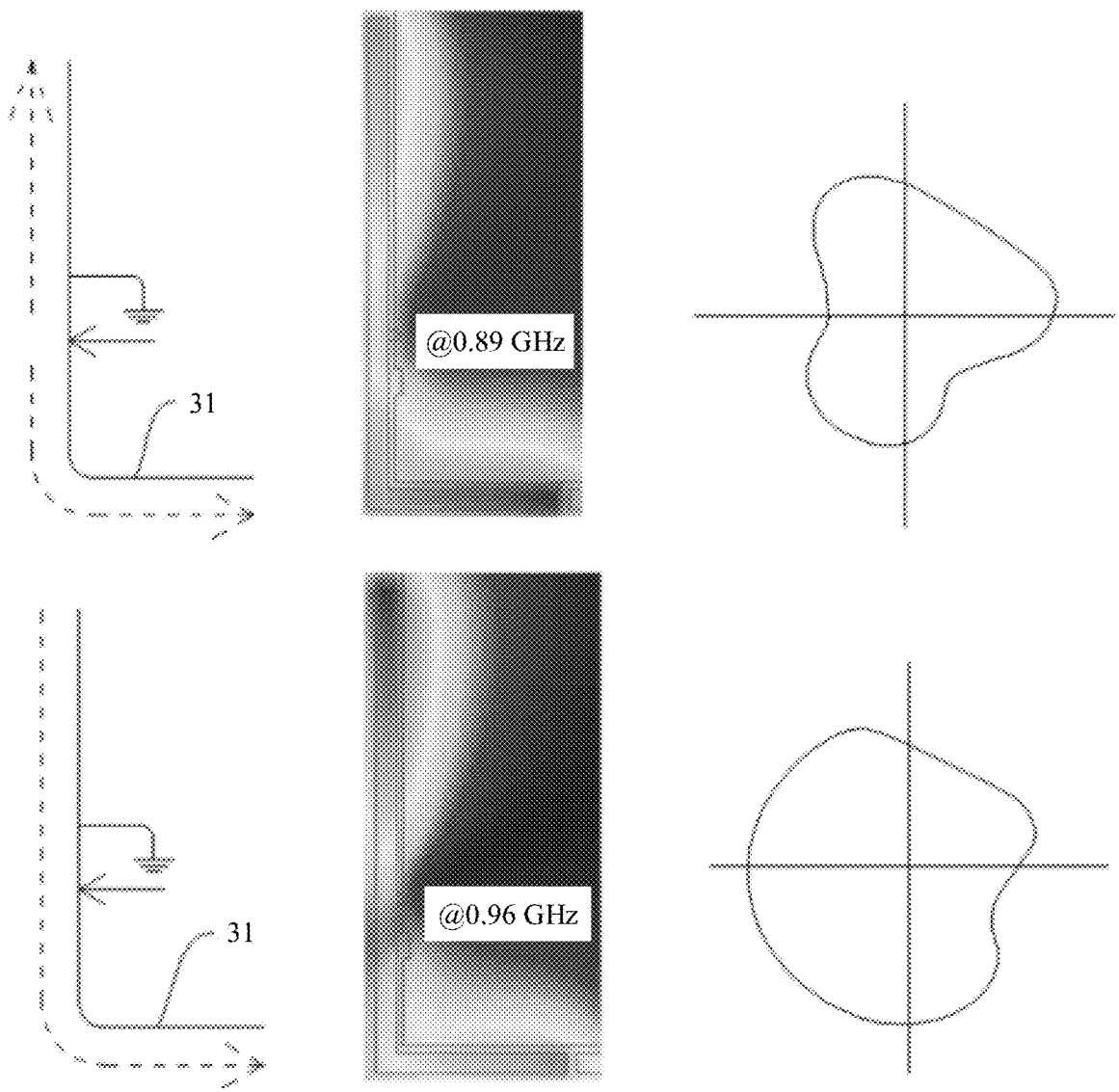
FIG. 21 shows simulation of a current, an electric field, and a radiation direction of a second feeding antenna in an example structure of the antenna architecture shown in FIG. 17.

For example, FIG. 19 is a reflection coefficient line graph of the second feeding antenna 31 in an example structure of the antenna architecture shown in FIG. 17, FIG. 20 is an efficiency line graph of the second feeding antenna 31 in an example structure of the antenna architecture shown in FIG. 17, and FIG. 21 is a simulation diagram of a current, an electric field, and a radiation direction of the second feeding antenna 31 in an example structure of the antenna architecture shown in FIG. 17. FIG. 19 to FIG. 21 correspond to an example structure when the first part 10 and the second part 20 are in the open state and the second feeding antenna 31 is not coupled to the first parasitic antenna 21. In FIG. 20, a horizontal coordinate represents a frequency (in a unit of GHz), and a vertical coordinate represents a reflection coefficient (in a unit of dB). In FIG. 21, a horizontal coordinate represents a frequency (in a unit of GHz), and a vertical coordinate represents efficiency (in a unit of dB). FIG. 21 corresponds to simulation diagrams of the second feeding antenna 31 respectively at 890 MHz and 960 MHz.

In the example structure corresponding to FIG. 19 to FIG. 21, the second feeding antenna 31 is a ½ wavelength antenna. The second feeding antenna 31 is a frame antenna. A frame thickness and width of the electronic device 100 are approximately 4 millimeters and 3 millimeters, respectively. A width of a clearance area between the frame of the electronic device 100 and the ground plane 70 is approximately 1 millimeter. A gap width between two adjacent metal segments in the frame of the electronic device 100 is approximately 1.5 millimeters. A dielectric constant and a loss angle of an insulating material used for an insulation segment between two adjacent metal segments and an insulating material filled in the clearance area between the frame of the electronic device 100 and the ground plane 70 are 3.0 and 0.01, respectively.

It can be learned from FIG. 19 to FIG. 21 that when the second feeding antenna 31 is a ½ wavelength antenna, the second feeding antenna 31 has two antenna modes, relatively large bandwidth, and relatively high antenna performance.

It may be understood that, in some embodiments, the second feeding antenna 31 may also be coupled to the first parasitic antenna 21. In this case, although a switching circuit (refer to the switching circuit 22) needs to be disposed on the first parasitic antenna 21, antenna performance of the second feeding antenna 31 when the first part 10 and the second part 20 are in the open state is also improved to some extent.

In an embodiment, as shown in FIG. 17, the first feeding antenna 11 may be a ½ wavelength antenna. For antenna performance of the first feeding antenna 11 when the first part 10 and the second part 20 are in the open state, refer to the second feeding antenna 31.

In this case, when the first part 10 and the second part 20 are in the open state, the first feeding antenna 11 and the second feeding antenna 31 may be separately located in two diagonally disposed corner regions of the electronic device 100. The first parasitic antenna 21 and the second parasitic antenna 41 of the electronic device 100 may be located in the other two diagonally disposed corner regions of the electronic device 100.

Figure 22:
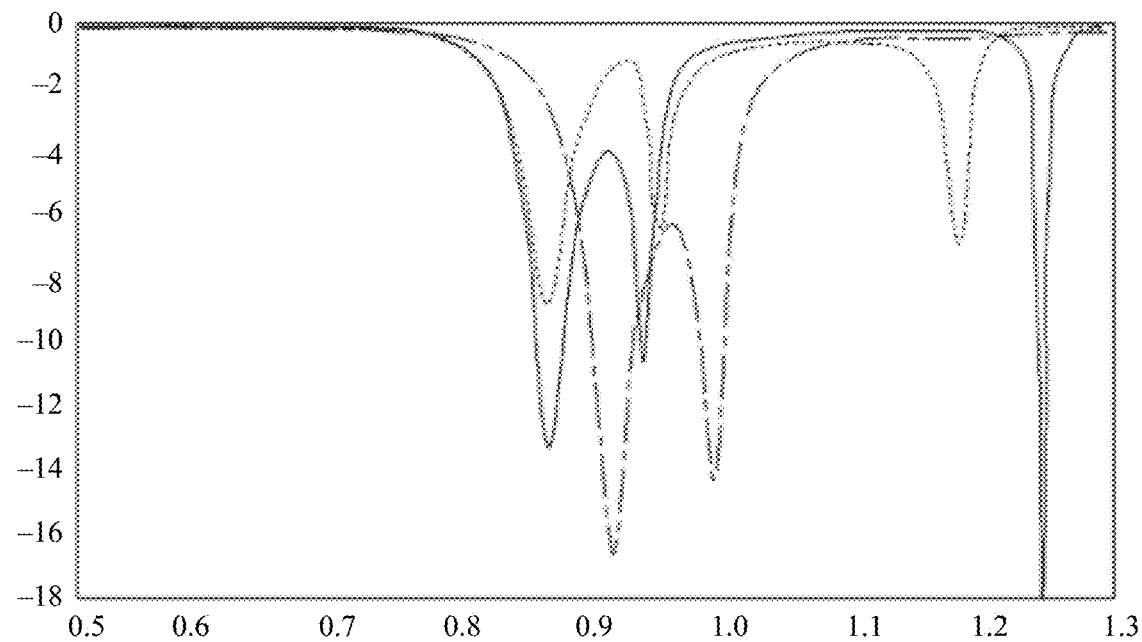
FIG. 22 is a reflection coefficient line graph of an example structure of the antenna architecture shown in FIG. 17.
Figure 23:
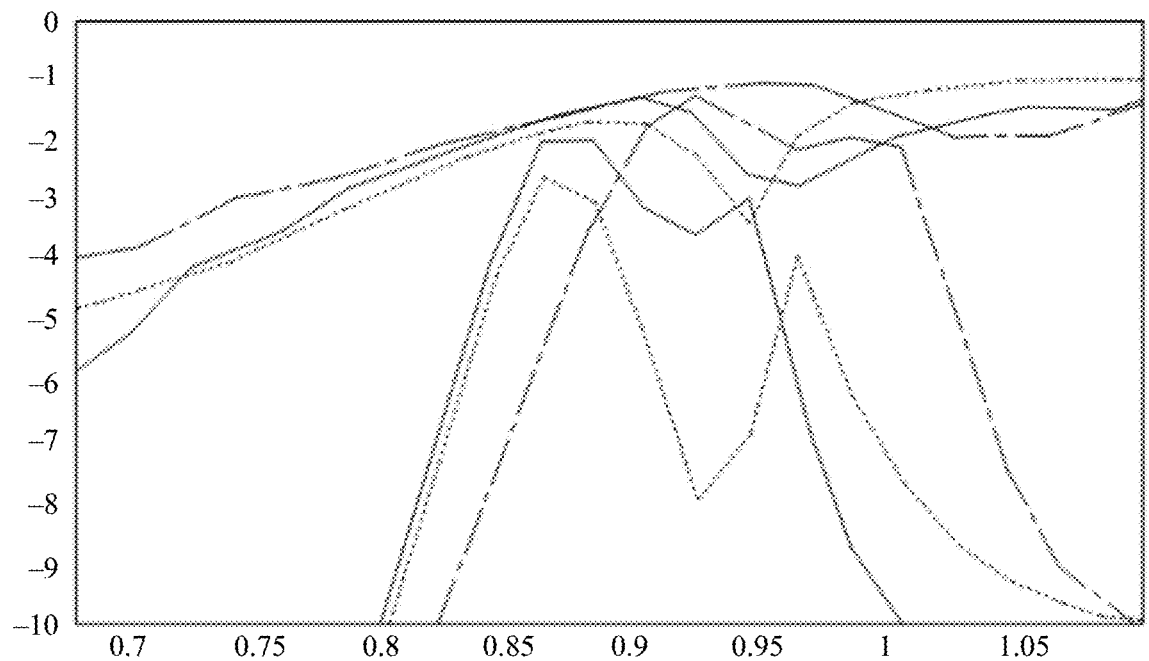
FIG. 23 is an efficiency line graph of an example structure of the antenna architecture shown in FIG. 17.

For example, FIG. 22 is a reflection coefficient line graph of an example structure of the antenna architecture shown in FIG. 17, and FIG. 23 is an efficiency line graph of an example structure of the antenna architecture shown in FIG. 17. In FIG. 22 and FIG. 23, solid lines represent performance when the first feeding antenna 11 (½ wavelength antenna) is coupled to the first parasitic antenna 21 with an electrical length of ½ wavelength and the first part 10 and the second part 20 are in the closed state, dotted lines represent performance when the first feeding antenna 11 (½ wavelength antenna) is coupled to the first parasitic antenna 21 with an electrical length of ¼ wavelength and the first part 10 and the second part 20 are in the closed state, and dash dot lines represent performance when the first feeding antenna 11 (½ wavelength antenna) is not coupled to the first parasitic antenna 21 and the first part 10 and the second part 20 are in the open state. In FIG. 22, a horizontal coordinate represents a frequency (in a unit of GHz), and a vertical coordinate represents a reflection coefficient (in a unit of dB). In FIG. 23, a horizontal coordinate represents a frequency (in a unit of GHz), and a vertical coordinate represents efficiency (in a unit of dB).

In the example structure corresponding to FIG. 22 and FIG. 23, the first feeding antenna 11 is a frame antenna. The first parasitic antenna 21 is a frame antenna. When the first part 10 and the second part 20 are in the open state, the first feeding antenna 11 is located in an upper right corner of the electronic device 100, and the first parasitic antenna 21 is located in a lower right corner of the electronic device 100. A frame thickness and width of the electronic device 100 are approximately 4 millimeters and 3 millimeters, respectively. A width of a clearance area between the frame of the electronic device 100 and the ground plane 70 is approximately 1 millimeter. A gap width between two adjacent metal segments in the frame of the electronic device 100 is approximately 1.5 millimeters. A dielectric constant and a loss angle of an insulating material used for an insulation segment between two adjacent metal segments and an insulating material filled in the clearance area between the frame of the electronic device 100 and the ground plane 70 are 3.0 and 0.01, respectively. The rotation part 50 of the first part 10 and the second part 20 is located in the central region of the electronic device 100. When the first part 10 and the second part 20 are in the closed state, a distance between the frame 101 of the first part 10 and the frame 201 of the second part 20 in a thickness direction of the electronic device 100 is approximately 1 millimeter.

It can be learned from FIG. 22 and FIG. 23 that when the first feeding antenna 11 is coupled to the first parasitic antenna 21, the first excited resonance signal generated by the first parasitic antenna 21 through coupling and excitation is generated at a highest resonance. Antenna performance of the first feeding antenna 11 when the first part 10 and the second part 20 are in the closed state and the first feeding antenna 11 is coupled to the first parasitic antenna 21 with an electrical length of ½ wavelength is slightly lower than antenna performance when the first part 10 and the second part 20 are in the open state, but higher than antenna performance when the first part 10 and the second part 20 are in the closed state and the first feeding antenna 11 is coupled to the first parasitic antenna 21 with an electrical length of ¼ wavelength.

In an embodiment, the electronic device 100 further includes one or more second tuning circuits (not shown). The one or more second tuning circuits are connected to the first parasitic antenna 21, and are configured to adjust a frequency band of an excited resonance of the first parasitic antenna 21, so that when the first feeding antenna 11 is coupled to the first parasitic antenna 21, better antenna performance can be obtained. Certainly, in another embodiment, a physical length of the first parasitic antenna 21 is adjusted synchronously or separately, so that when the first feeding antenna 11 is coupled to the first parasitic antenna 21, better antenna performance can be obtained.

In an embodiment, further referring to FIG. 17 and FIG. 18, the electronic device 100 further includes a fifth feeding antenna 61, a fifth feeding circuit 62, a fifth grounding circuit 63, and a third parasitic antenna 71. The fifth feeding antenna 61 is located in the second part 20, and the third parasitic antenna 71 is located in the first part 10 (in another embodiment, the fifth feeding antenna 61 may be located in the first part 10, and the third parasitic antenna 71 may be located in the second part 20). The fifth feeding antenna 61 is electrically isolated from the first parasitic antenna 21 and the second feeding antenna 31. The fifth feeding circuit 62 is connected to the fifth feeding antenna 61, and is configured to feed the fifth feeding antenna 61. The fifth grounding circuit 63 is connected to the fifth feeding antenna 61, and is configured to enable the fifth feeding antenna 61 to be grounded. When the first part 10 and the second part 20 are in the closed state, the third parasitic antenna 71 is not grounded and can be coupled to the fifth feeding antenna 61 to generate a fifth excited resonance signal through excitation. In this case, an electrical length of the third parasitic antenna 71 is ½ wavelength, in other words, the third parasitic antenna 71 is a ½ wavelength antenna. In this embodiment, the fifth feeding antenna 61 may be configured to radiate a medium- and high-frequency signal.

Figure 24:
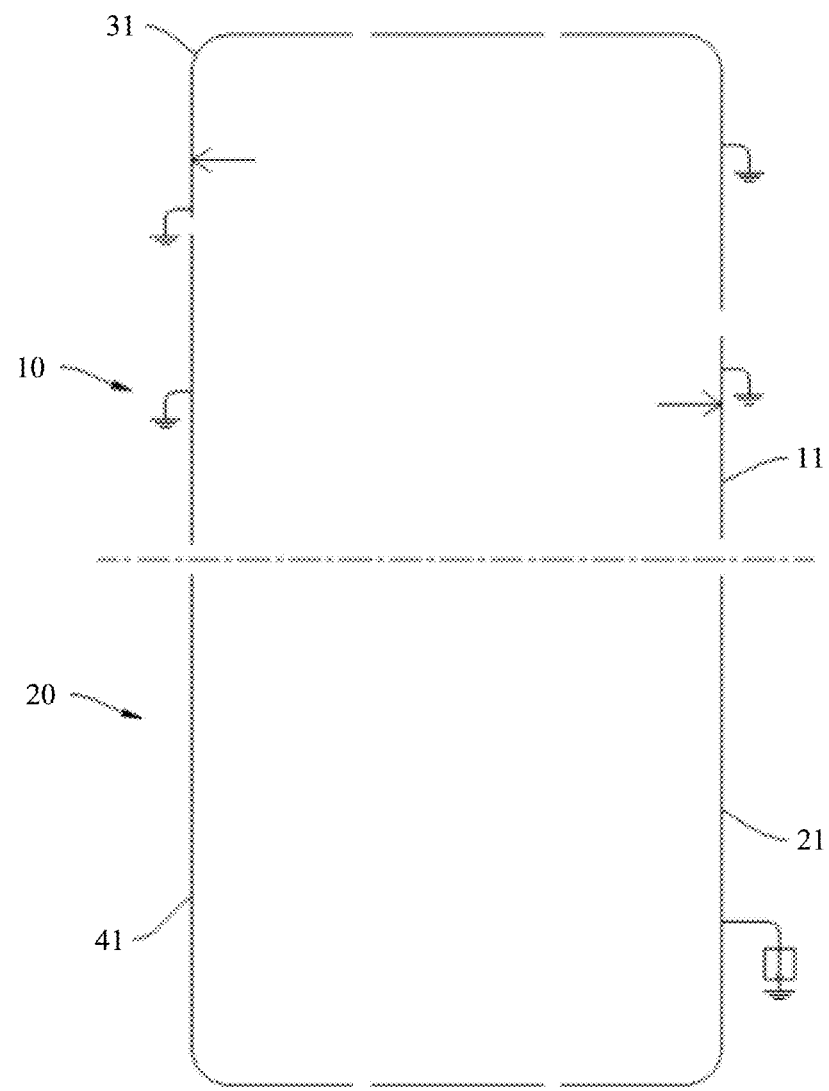
FIG. 24 is a schematic diagram of an antenna architecture of the electronic device shown in FIG. 1 in another embodiment.

FIG. 24 is a schematic diagram of an antenna architecture of the electronic device shown in FIG. 1 in another embodiment. FIG. 24 corresponds to the open state of the first part 10 and the second part 20. Most technical content of the antenna architecture shown in this embodiment that is the same as that of the antenna architecture shown in the foregoing embodiment is not described again.

In an embodiment, the second feeding antenna 31 is located in the first part 10 instead of the second part 20. Specifically, the first part 10 further includes the second feeding antenna 31, and the second feeding antenna 31 is electrically isolated from the first feeding antenna 11. In this case, the second parasitic antenna 41 is located in the second part 20 instead of the first part 10, so that when the first part 10 and the second part 20 are in the closed state, the second parasitic antenna 41 can be coupled to the second feeding antenna 31.

The first feeding antenna 11 and the second feeding antenna 31 are disposed as far as possible away from each other, so that both the first feeding antenna 11 and the second feeding antenna 31 have relatively sufficient radiation space.

In this disclosure, the first feeding antenna 11, the first parasitic antenna 21, the second feeding antenna 31, and the second parasitic antenna 41 may be arranged in a plurality of manners, provided that when the first part 10 and the second part 20 are in the closed state, the first feeding antenna 11 is coupled to the first parasitic antenna 21, and the second feeding antenna 31 is coupled to the second parasitic antenna 41. This is not strictly limited in this disclosure.

Figure 25:
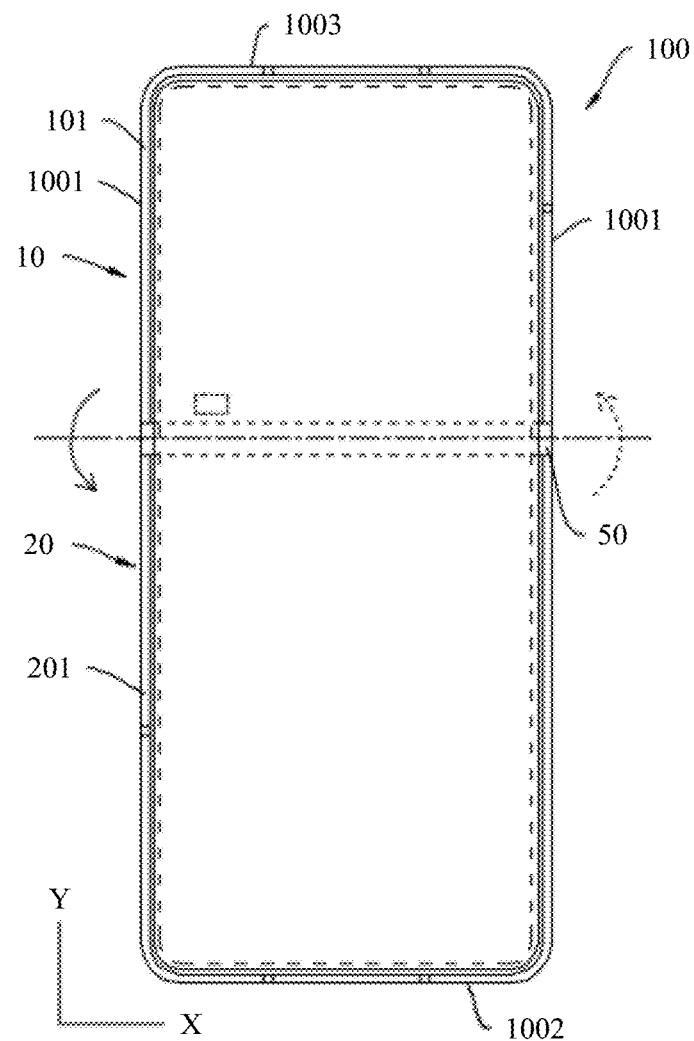
FIG. 25 is a schematic structural diagram of an electronic device in a second embodiment according to the embodiments of this disclosure.
Figure 26:
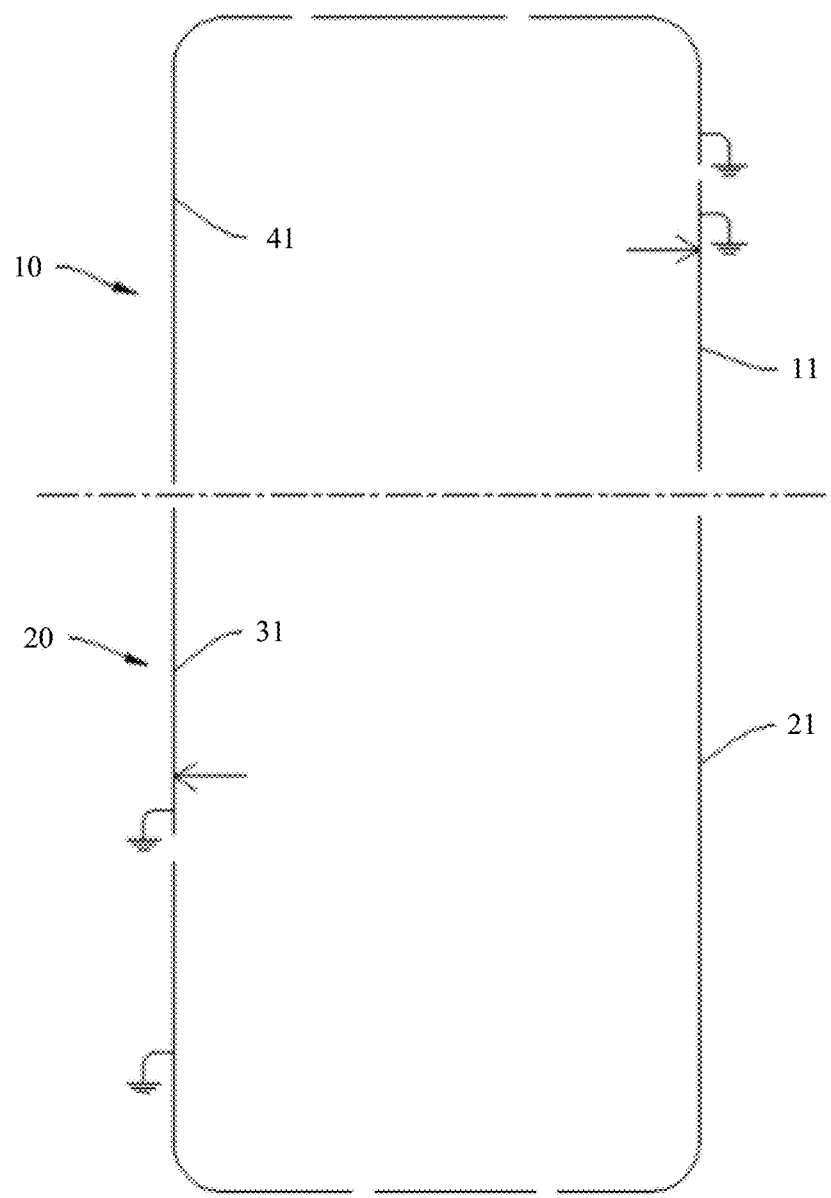
FIG. 26 is a schematic diagram of an antenna architecture of the electronic device shown in FIG. 25.

FIG. 25 is a schematic structural diagram of an electronic device in a second embodiment according to the embodiments of this disclosure, and FIG. 26 is a schematic diagram of an antenna architecture of the electronic device shown in FIG. 25. Most technical content of the electronic device 100 shown in the second embodiment that is the same as that of the electronic device 100 shown in the first embodiment is not described again.

In the second embodiment, the rotation part 50 deviates from the central region of the electronic device 100 instead of being located in the central region of the electronic device 100. Specifically, the electronic device 100 further includes the rotation part 50, the rotation part 50 connects the first part 10 and the second part 20, and the rotation part 50 can be deformed, so that the first part 10 and the second part 20 rotate relative to each other to fold or expand. The rotation part 50 deviates from the central region of the electronic device 100. In this case, a deviation between the center line of the rotation part 50 and the center line of the electronic device 100 is relatively large. When the first part 10 and the second part 20 are in the closed state, an end of one of the first part 10 and the second part 20 protrudes relative to the other part. For example, in this embodiment, the rotation part 50 extends in the first direction X. In the second direction perpendicular to the first direction X, a length of the second part 20 is greater than a length of the first part 10, and when the first part 10 and the second part 20 are in the closed state, an end of the second part 20 that is away from the first part 10 protrudes relative to the first part 10. When the first part 10 and the second part 20 are in the closed state, the frame 101 of the first part 10 and the frame 201 of the second part 20 partially overlap. In other words, the frame 101 of the first part 10 and the frame 201 of the second part 20 are disposed partially opposite to each other.

When the first part 10 and the second part 20 are in the open state, the electronic device 100 includes two side edges 1001 spanning the rotation part 50. The two side edges 1001 extend in the first direction X. The first feeding antenna 11 and the first parasitic antenna 21 are located on a same side edge 1001. In this case, when the first part 10 and the second part 20 are in the closed state, the first feeding antenna 11 and the first parasitic antenna 21 can be coupled to each other. The second feeding antenna 31 and the first feeding antenna 11 are located on different side edges 1001. In this case, both the first feeding antenna 11 and the second feeding antenna 31 have relatively large radiation space.

The first parasitic antenna 21 may extend from a side edge 1001 of the electronic device 100 to another edge 1002 of the electronic device 100 along an edge of a corner region. The second parasitic antenna 41 may extend from the other side edge 1001 of the electronic device 100 to another edge 1003 of the electronic device 100 along another corner region.

Figure 27:
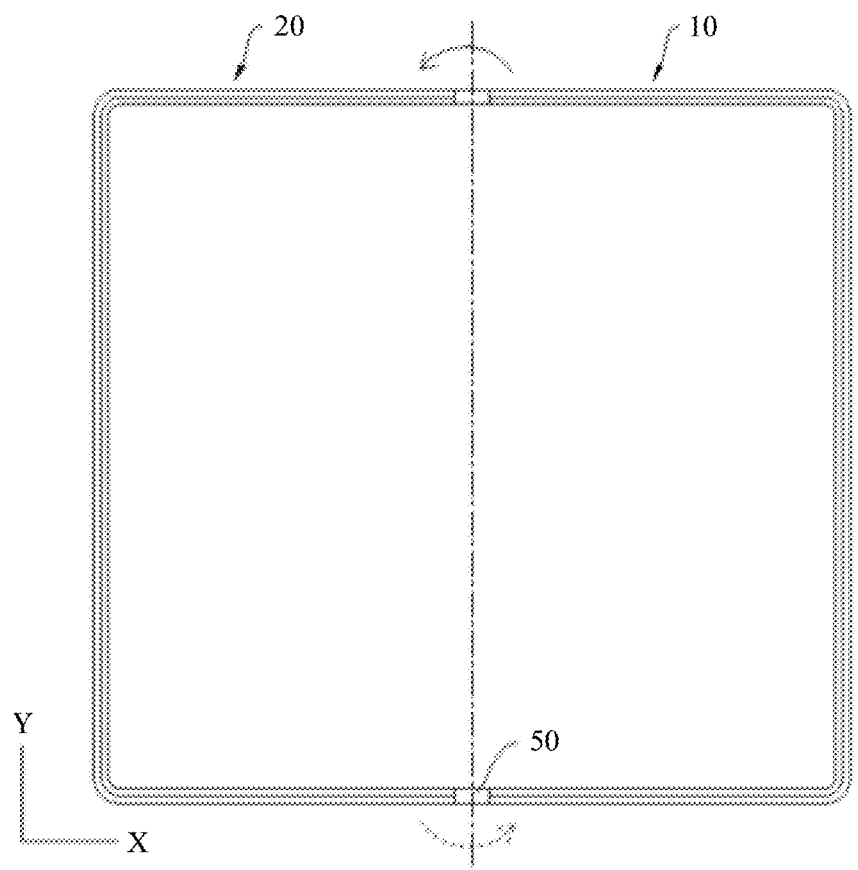
FIG. 27 is a schematic structural diagram of an electronic device in a third embodiment according to the embodiments of this disclosure.

FIG. 27 is a schematic structural diagram of an electronic device in a third embodiment according to the embodiments of this disclosure. Most technical content of the electronic device 100 shown in the third embodiment that is the same as that of the electronic device 100 described above is not described again.

Sizes of the first part 10 and the second part 20 in this embodiment are slightly different from sizes of the first part 10 and the second part 20 in the foregoing embodiments. In this embodiment, the rotation part 50 extends in the second direction Y. A conventional flip manner of the first part 10 and the second part 20 in this embodiment is flipping left or right, and a conventional flip manner in the foregoing embodiments is flipping upward or downward. The conventional flip manner of the first part 10 and the second part 20 of the electronic device 100 corresponds to disposing locations of some components in the electronic device 100, for example, a location of an earpiece, a location of a front-facing camera, and the like.

Figure 28:
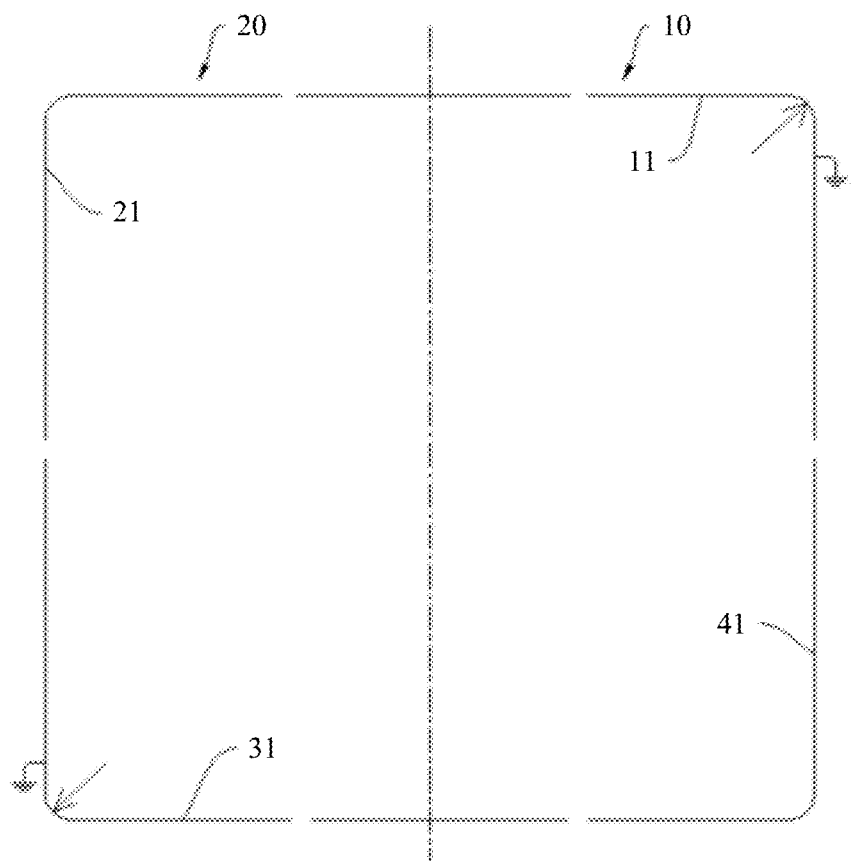
FIG. 28 is a schematic diagram of an antenna architecture of the electronic device shown in FIG. 27 in an embodiment.

FIG. 28 is a schematic diagram of an antenna architecture of the electronic device shown in FIG. 27 in an embodiment.

The first part 10 includes a first feeding antenna 11 and a second parasitic antenna 41. The second part 20 includes a second feeding antenna 31 and a first parasitic antenna 21. When the first part 10 and the second part 20 are in the open state, the first feeding antenna 11, the second parasitic antenna 41, the second feeding antenna 31, and the first parasitic antenna 21 are separately located in four corner regions of the electronic device 100. When the first part 10 and the second part 20 are in the closed state, the first feeding antenna 11 is coupled to the first parasitic antenna 21 with an electrical length of ½ wavelength, and the second feeding antenna 31 is coupled to the second parasitic antenna 41 with an electrical length of ½ wavelength.

In an embodiment, the first feeding antenna 11 and the second feeding antenna 31 are ½ wavelength antennas, and the first parasitic antenna 21 and the second parasitic antenna 41 are ½ wavelength floating antennas.

In another embodiment, the first feeding antenna 11 and the second feeding antenna 31 may be alternatively ¼ wavelength antennas. In this case, a switching circuit (refer to the switching circuit 22) is connected to each of the first parasitic antenna 21 and the second parasitic antenna 41, and the switching circuit is configured to switch an electrical length of the antenna.

Figure 29:
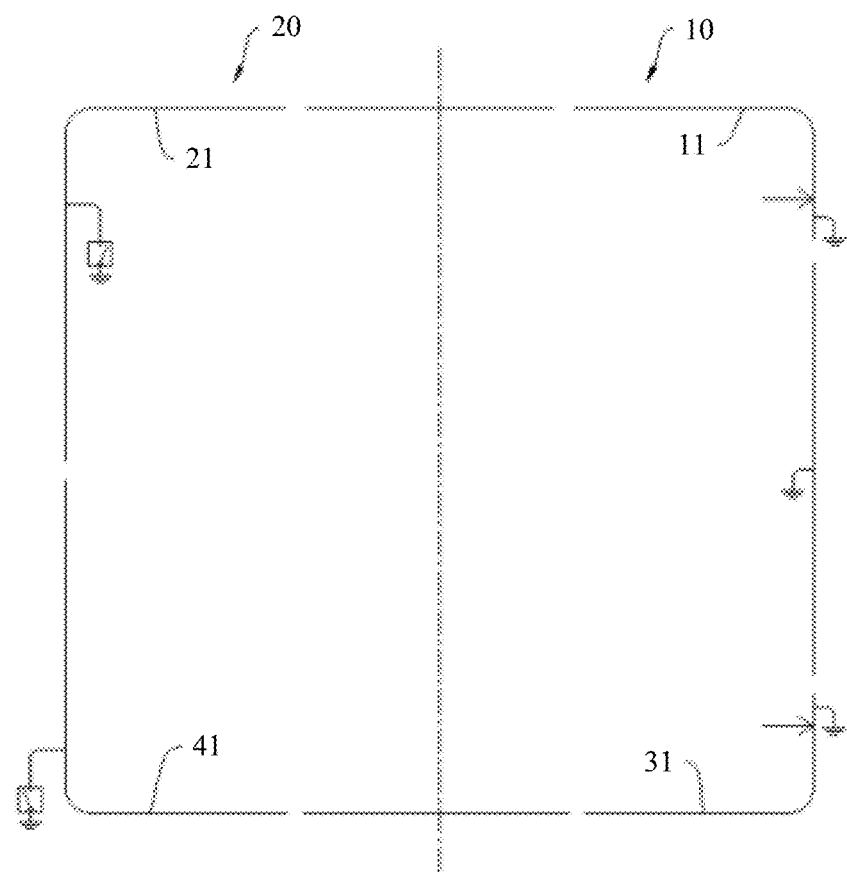
FIG. 29 is a schematic diagram of an antenna architecture of the electronic device shown in FIG. 27 in an embodiment.

FIG. 29 is a schematic diagram of an antenna architecture of the electronic device shown in FIG. 27 in another embodiment.

The first part 10 includes a first feeding antenna 11 and a second feeding antenna 31. The second part 20 includes a first parasitic antenna 21 and a second parasitic antenna 41. When the first part 10 and the second part 20 are in the open state, the first feeding antenna 11, the second parasitic antenna 41, the second feeding antenna 31, and the first parasitic antenna 21 are separately located in four corner regions of the electronic device 100. When the first part 10 and the second part 20 are in the closed state, the first feeding antenna 11 is coupled to the first parasitic antenna 21 with an electrical length of ½ wavelength, and the second feeding antenna 31 is coupled to the second parasitic antenna 41 with an electrical length of ½ wavelength.

In an embodiment, the first feeding antenna 11 and the second feeding antenna 31 are ¼ wavelength antennas. A switching circuit (refer to the switching circuit 22) is connected to each of the first parasitic antenna 21 and the second parasitic antenna 41, and the switching circuit is configured to switch an electrical length of the antenna.

In another embodiment, the first feeding antenna 11 and the second feeding antenna 31 may be alternatively ½ wavelength antennas, and in this case, the first parasitic antenna 21 and the second parasitic antenna 41 are ½ wavelength floating antennas.

Figure 30:
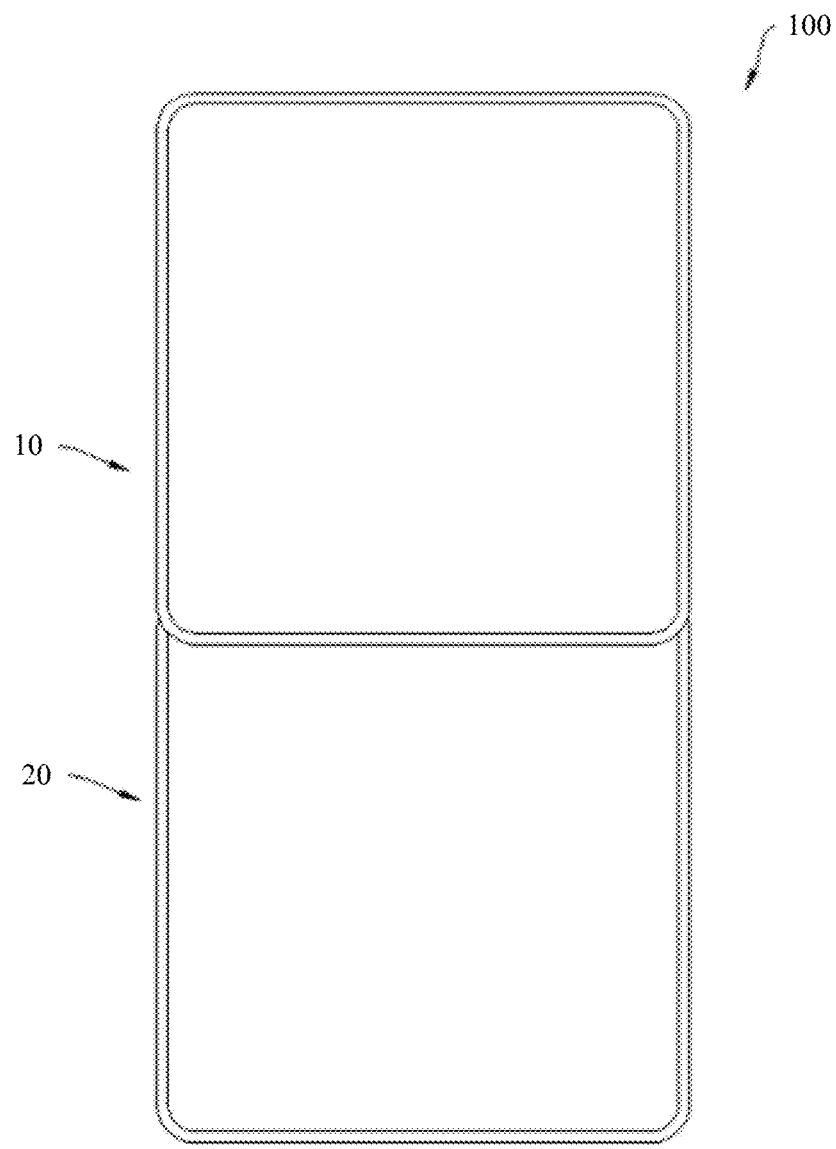
FIG. 30 is a schematic structural diagram of an electronic device in a fourth embodiment according to the embodiments of this disclosure.

In the foregoing embodiments, the first part 10 and the second part 20 are switched between the open state and the closed state through relative rotation. In another embodiment, the first part 10 and the second part 20 may be alternatively switched between the open state and the closed state through relative sliding. An example is as follows:

FIG. 30 is a schematic structural diagram of an electronic device in a fourth embodiment according to the embodiments of this disclosure. Most technical content of the electronic device 100 shown in the third embodiment that is the same as that of the electronic device 100 described above is not described again.

The electronic device 100 includes a first part 10 and a second part 20. The first part 10 is slidably connected to the second part 20. When sliding relative to each other, the first part 10 and the second part 20 can be folded relative to each other to a closed state, and can be expanded relative to each other to an open state. When the first part 10 and the second part 20 are in the closed state, the first part 10 and the second part 20 are vertically stacked. When the first part 10 and the second part 20 are in the open state, a small portion of the first part 10 and a small portion of the second part 20 remain in a stacked state, and most of the first part 10 and most of the second part 20 are in a staggered state, namely, an expanded state. In an embodiment, when the first part 10 and the second part 20 are in the open state, the first part 10 and the second part 20 may be totally staggered.

In an embodiment, an example in which the first part 10 is located above the second part 20 is used for description. In another embodiment, the first part 10 may be alternatively located below the second part 20.

Figure 31:
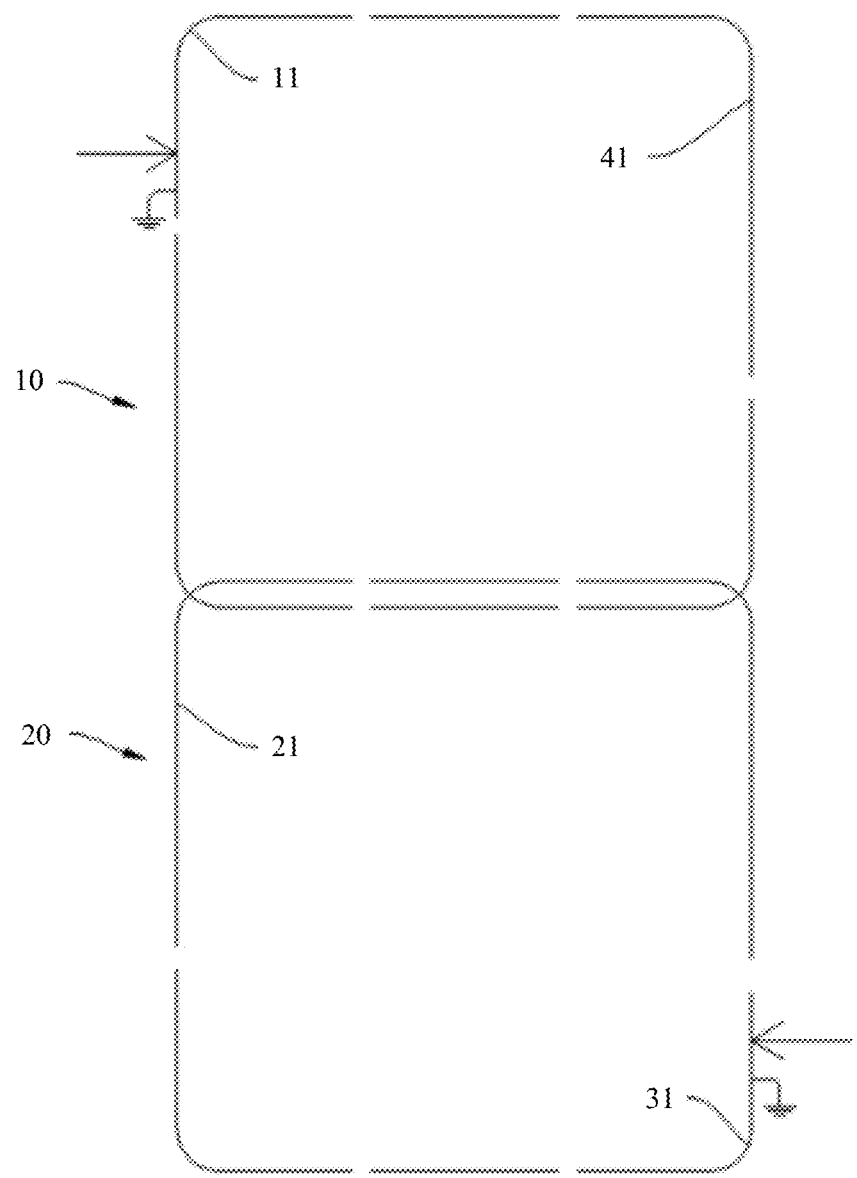
FIG. 31 is a schematic diagram of an antenna architecture of the electronic device shown in FIG. 30.
Figure 32:
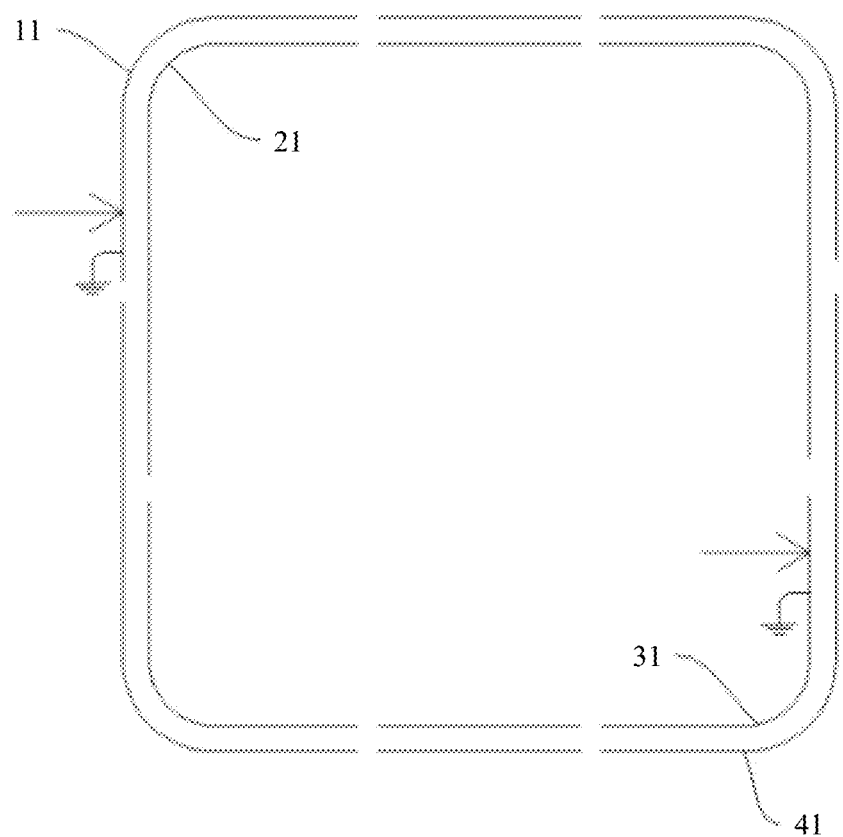
FIG. 32 is a schematic diagram of the antenna architecture shown in FIG. 31 in another use state.

FIG. 31 is a schematic diagram of an antenna architecture of the electronic device shown in FIG. 30, and FIG. 32 is a schematic diagram of the antenna architecture shown in FIG. 31 in another use state. FIG. 31 corresponds to a structure when the first part 10 and the second part 20 are in the open state. FIG. 32 corresponds to a structure when the first part 10 and the second part 20 are in the closed state. In FIG. 32, because antennas in the first part 10 and the second part 20 overlap in the closed state, the antennas in the first part 10 and the second part 20 are illustrated through staggering, so that the antenna in the first part 10 is located on an outer side of the antenna located in the second part 20.

The first part 10 includes a first feeding antenna 11, and the second part 20 includes a first parasitic antenna 21. When the first part 10 and the second part 20 are in the closed state, the first parasitic antenna 21 is not grounded and can be coupled to the first feeding antenna 11 to generate a first excited resonance signal through excitation. In this case, an electrical length of the first parasitic antenna 21 is ½ wavelength, in other words, the first parasitic antenna 21 is a ½ wavelength antenna.

The second part 20 further includes a second feeding antenna 31. When the first part 10 and the second part 20 are in the closed state, the first feeding antenna 11 and the second feeding antenna 31 are separately located in two diagonally disposed corner regions of the electronic device 100. In this case, both the first feeding antenna 11 and the second feeding antenna 31 have relatively sufficient radiation space.

The first part 10 may further include a second parasitic antenna 41. When the first part 10 and the second part 20 are in the closed state, the second parasitic antenna 41 is not grounded and can be coupled to the second feeding antenna 31 to generate a third excited resonance signal through excitation. In this case, an electrical length of the second parasitic antenna 41 is ½ wavelength, in other words, the second parasitic antenna 41 is a ½ wavelength antenna.

In another embodiment, the second feeding antenna 31 may be alternatively located in the first part 10. The second feeding antenna 31 and the first feeding antenna 11 are electrically isolated, and are separately located in corner regions of two diagonal angles of the first part 10. In this case, the second parasitic antenna 41 is located in the first part 10.

In another embodiment, the first part 10 and the second part 20 may be alternatively switched between the open state and the closed state in another manner (for example, a detachable snap-fit manner). This may be specifically determined based on an actual requirement, and is not limited in this embodiment of this disclosure.

The foregoing descriptions are merely specific embodiments of this disclosure, but are not intended to limit the protection scope of this disclosure. Any variation or replacement readily figured out by a person skilled in the art within the technical scope disclosed in this disclosure shall fall within the protection scope of this disclosure. If there is no conflict, the embodiments of this disclosure and the features in the embodiments may be combined with each other. Therefore, the protection scope of this disclosure shall be subject to the protection scope of the claims.

What is claimed is:

1. An electronic device, comprising a first part and a second part, wherein the first part and the second part are configured to be folded relative to each other to a closed state, and are configured to be expanded relative to each other to an open state, and when the first part and the second part are in the closed state, a first frame of the first part and a second frame of the second part are partially or totally overlapped, wherein the first part has a first feeding antenna, a first feeding circuit coupled to the first feeding antenna, and a first grounding circuit coupled to the first feeding antenna, wherein the first feeding circuit is configured to feed the first feeding antenna, the first feeding antenna comprises a first open end and a grounded end, and the first grounding circuit is configured to ground the first feeding antenna at the grounded end; and wherein theft second part has a first parasitic antenna, the first parasitic antenna comprises a second open end and a third open end, wherein a length of the first feeding antenna is less than a length of the first parasitic antenna, and wherein when the electronic device is in the closed state, the first feeding antenna is configured to generate a first resonance, the first parasitic antenna is not grounded and is configured to be coupled to the first feeding antenna to generate a second resonance, wherein the second resonance extends a bandwidth of the first resonance in a predetermined frequency band.

2. The electronic device according to claim 1, wherein when the electronic device is in the closed state, the first open end of the first feeding antenna and the second open end of the first parasitic antenna are aligned.

3. The electronic device according to claim 1, wherein the first parasitic antenna is a ½ wavelength antenna.

4. The electronic device according to claim 1, wherein the second part further comprises a first tuning circuit coupled to the first parasitic antenna, and is configured to adjust an electrical length of the first parasitic antenna.

5. The electronic device according to claim 1, wherein when the electronic device is in the open state, the first feeding antenna and the first parasitic antenna are located in different corner regions of the electronic device.

6. The electronic device according to claim 1, further comprising a rotation part that connects the first part and the second part, so that the first part and the second part rotate relative to each other; and wherein when the electronic device is in the open state, the electronic device comprises two side edges spanning the rotation part, and the first feeding antenna and the first parasitic antenna are located on a same side edge.

7. The electronic device according to claim 1, wherein the second part further comprises a second feeding antenna electrically isolated from the first parasitic antenna, wherein when the electronic device is in the open state, the first parasitic antenna is net-configured to be coupled to the second feeding antenna to generate a third resonance.

8. The electronic device according to claim 7, wherein the second part further comprises a second feeding circuit and a second grounding circuit, wherein the second grounding circuit is connected to a middle part of the second feeding antenna, both ends of the second feeding antenna are ungrounded open ends, the second feeding circuit is connected to the second feeding antenna, a connection position of the second feeding circuit on the second feeding antenna is located between a connection position of the second grounding circuit on the second feeding antenna and one end of the second feeding antenna.

9. The electronic device according to claim 7, wherein when the electronic device is in the open state, the first feeding antenna, the second feeding antenna, and the first parasitic antenna are located in different corner regions of the electronic device.

10. The electronic device according to claim 7, further comprising a rotation part that connects the first part and the second part, so that the first part and the second part rotate relative to each other; wherein when the electronic device is in the open state, the electronic device comprises two side edges spanning the rotation part, the first feeding antenna and the first parasitic antenna are located on a same side edge, and the second feeding antenna and the first feeding antenna are located on different side edges.

11. The electronic device according to claim 1, wherein the first parasitic antenna is a floating antenna.

12. The electronic device according to claim 1, wherein the first feeding antenna and the first parasitic antenna are a part of a frame of the electronic device.

13. The electronic device according to claim 1, further comprising a sensing apparatus located in at least one of the first part or the second part, wherein the sensing apparatus is configured to sense that the electronic device is in the closed state or the open state.

14. The electronic device according to claim 1, wherein when the electronic device is in the closed state, the first feeding antenna is a ¼ wavelength antenna.

15. The electronic device according to claim 1, wherein a resonant frequency of the first resonance is lower than a resonant frequency of the second resonance.

16. The electronic device according to claim 1, wherein the second resonance is configured to be adjacent to the first resonance, and the predetermined frequency band is a low frequency band from 600 MHz to 960 MHz.

17. An electronic device, comprising a first part and a second part, wherein the first part and the second part is configured to be folded relative to each other to a closed state, and are configured to be expanded relative to each other to an open state, and when the first part and the second part are in the closed state, a first frame of the first part and a second frame of the second part are partially or totally overlapped, wherein the first part includes a first feeding antenna, a first feeding circuit coupled to the first feeding antenna, and a first grounding circuit coupled to the first feeding antenna, wherein the first feeding circuit is configured to feed the first feeding antenna, the first feeding antenna comprises a first open end and a grounded end, and the first grounding circuit is configured to ground the first feeding antenna at the grounded end; and the second part includes a first parasitic antenna, the first parasitic antenna comprises a second open end and a third open end, wherein a length of the first feeding antenna is less than a length of the first parasitic antenna, and wherein when the electronic device is in the closed state, the first feeding antenna is configured to generate a first resonance, the first parasitic antenna is a ½ wavelength antenna and is configured to be coupled to the first feeding antenna to generate a second resonance, wherein the second resonance extends a bandwidth of the first resonance in a predetermined frequency band.

18. The electronic device according to claim 17, wherein when the electronic device is in the closed state, the first feeding antenna is a ¼ wavelength antenna.

19. The electronic device according to claim 17, wherein the second part further comprises a second feeding antenna electrically isolated from the first parasitic antenna, wherein when the electronic device is in the open state, the first parasitic antenna is configured to be coupled to the second feeding antenna to generate a third resonance.

20. The electronic device according to claim 17, wherein the second resonance is configured to be adjacent to the first resonance, and the predetermined frequency band is a low frequency band from 600 MHz to 960 MHz.

* * * * *

UNITED STATES PATENT AND TRADEMARK OFFICE
CERTIFICATE OF CORRECTION

| | |
|---|---|
| PATENT NO. | : 11,984,646 B2 |
| APPLICATION NO. | : 17/610846 |
| DATED | : May 14, 2024 |
| INVENTOR(S) | : Pengfei Wu et al. |

It is certified that error appears in the above-identified patent and that said Letters Patent is hereby corrected as shown below:

In the Claims

In Claim 1, Column 29, Line 18, delete "wherein theft second part" and insert --wherein the second part--.

In Claim 7, Column 29, Line 55, delete "net-configured" and insert --configured--.

Signed and Sealed this
Thirteenth Day of August, 2024

Katherine Kelly Vidal
*Director of the United States Patent and Trademark Office*